US008243865B2

(12) United States Patent
Tsukamoto et al.

(10) Patent No.: US 8,243,865 B2
(45) Date of Patent: Aug. 14, 2012

(54) DATA PROCESSING APPARATUS

(75) Inventors: Nobunari Tsukamoto, Kanagawa (JP); Hidetoshi Ema, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 864 days.

(21) Appl. No.: 11/763,663

(22) Filed: Jun. 15, 2007

(65) Prior Publication Data

US 2007/0297548 A1   Dec. 27, 2007

(30) Foreign Application Priority Data

Jun. 21, 2006 (JP) .................................. 2006-171607

(51) Int. Cl.
*H04L 7/00* (2006.01)
(52) U.S. Cl. ........ 375/354; 375/136; 375/147; 375/213; 375/316; 375/355; 375/357; 375/360; 375/364; 375/373; 375/374; 375/375; 375/376
(58) Field of Classification Search .................. 375/354, 375/147, 213, 316, 355, 357, 360, 364, 373, 375/374, 375, 376; 370/503
See application file for complete search history.

(56) References Cited

U.S. PATENT DOCUMENTS

| | | | | |
|---|---|---|---|---|
| 6,496,552 B2 * | 12/2002 | Tomofuji et al. | ............. | 375/373 |
| 6,518,909 B1 * | 2/2003 | Yang et al. | ................... | 341/155 |
| 6,525,604 B2 * | 2/2003 | Eckert et al. | .................... | 330/69 |
| 6,850,580 B1 * | 2/2005 | Naoe | ............................. | 375/355 |
| 6,958,639 B2 * | 10/2005 | Park et al. | ...................... | 327/175 |
| 7,015,739 B2 * | 3/2006 | Lee et al. | ........................ | 327/175 |
| 7,298,807 B2 * | 11/2007 | Zerbe et al. | ...................... | 375/355 |
| 7,642,767 B2 * | 1/2010 | Willis | ........................ | 324/76.47 |
| 7,668,271 B2 * | 2/2010 | Kim et al. | ...................... | 375/354 |
| 2004/0091273 A1 * | 5/2004 | Brissette et al. | ............... | 398/175 |
| 2006/0203939 A1 * | 9/2006 | Chou et al. | ..................... | 375/319 |

FOREIGN PATENT DOCUMENTS

| | | |
|---|---|---|
| JP | 7-221744 | 8/1995 |
| JP | 2002-343020 | 11/2002 |
| JP | 2004-145709 | 5/2004 |
| JP | 2004-363833 | 12/2004 |
| JP | 2005-192192 | 7/2005 |
| JP | 2006-109082 | 4/2006 |

OTHER PUBLICATIONS

Japanese Office Action issued Feb. 14, 2012, in Patent Application No. 2006-171607.

* cited by examiner

*Primary Examiner* — Dhaval Patel
(74) *Attorney, Agent, or Firm* — Oblon, Spivak, McClelland, Maier & Neustadt, L.L.P.

(57) ABSTRACT

A disclosed data processing apparatus includes: a binarization unit binarizing input data based on a threshold voltage; a capture unit capturing data from a binary output binarized by the binarization unit; a duty cycle detection unit detecting a duty cycle of the binary output; and a control unit controlling a level of the input data based on the duty cycle detected by the duty cycle detection unit.

14 Claims, 21 Drawing Sheets

FIG.17 shows a block diagram with the following components and connections:

- INPUT SIGNAL → BINARIZATION UNIT (21)
- BINARIZATION UNIT → BINARY OUTPUT
- BINARY OUTPUT → CLOCK RECOVERY UNIT (91) and DATA CAPTURE UNIT (25)
- CLOCK RECOVERY UNIT → DATA CAPTURE UNIT
- DATA CAPTURE UNIT → OUTPUT DATA
- (220A dashed box encloses CLOCK RECOVERY UNIT and DATA CAPTURE UNIT)
- SIMULATED PULSE GENERATION UNIT (151) → DUTY CYCLE DETECTION UNIT (22), via SIMULATED PULSE
- DUTY CYCLE DETECTION UNIT → CONTROL UNIT (23A), via DUTY CYCLE
- ref → CONTROL UNIT
- CONTROL UNIT → BINARIZATION UNIT, via DUTY CYCLE CONTROL SIGNAL
- (210A dashed box encloses BINARIZATION UNIT and CONTROL UNIT)

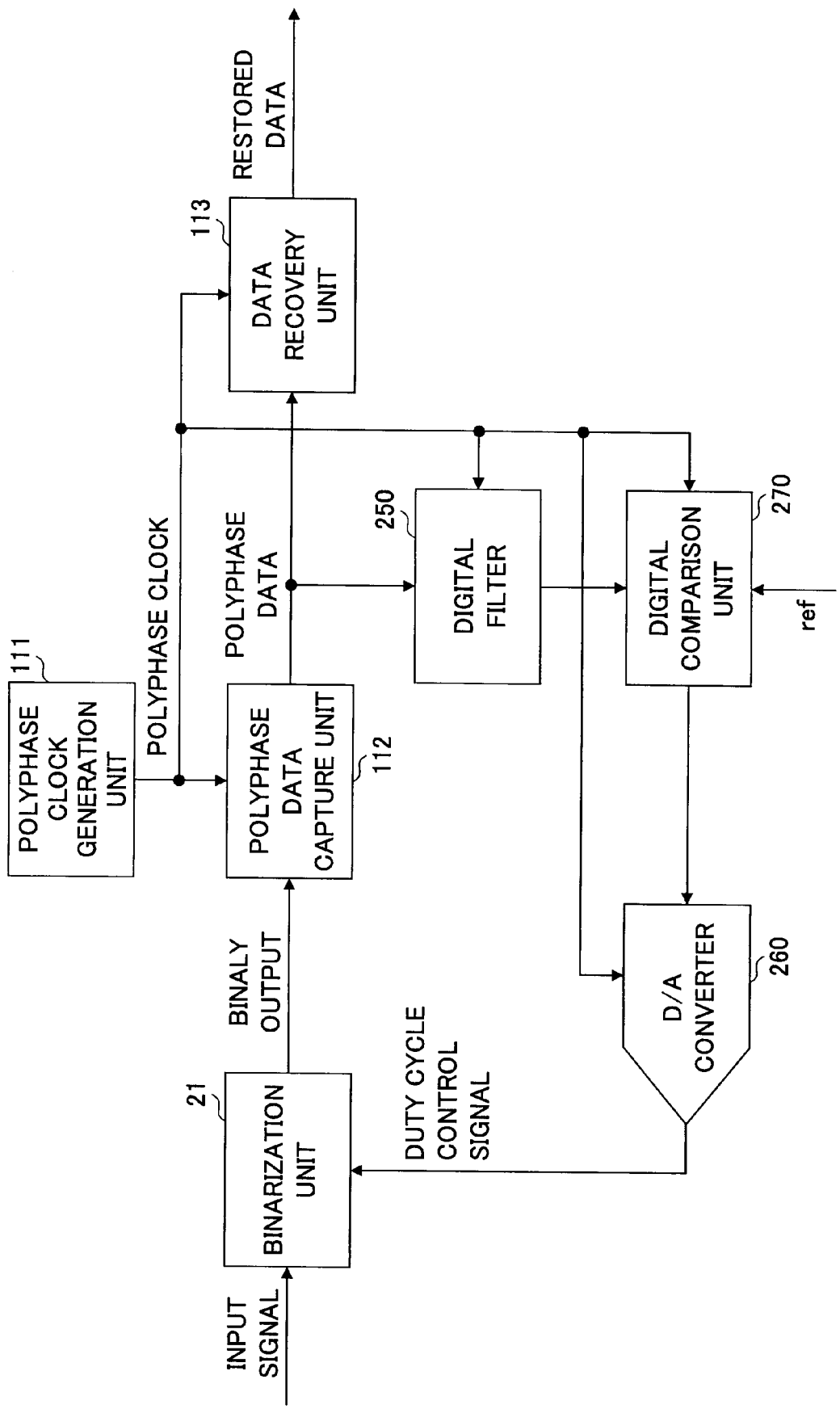

DATA PROCESSING APPARATUS

BACKGROUND OF THE INVENTION

1. Field of the Invention

The present invention relates to a data processing apparatus for binarizing input data based on a threshold voltage.

2. Description of the Related Art

Electronic devices of recent years have been required to transmit a large volume of data between the devices, boards on which IC chips are mounted, and the IC chips at a high speed, so that a frequency of a transmission clock used for data transmission has been steadily increased. When the frequency of the transmission clock has been increased in this manner, jitter tolerance of the transmission clock relative to transmission data is reduced and reception data obtained upon receiving transmission data is subject to degradation. Further, because of the degradation of the reception data, a transmission error is generated. Thus, preferably, the transmission clock is in precise synchronization with the transmission data.

For example, FIG. 1 is a diagram showing an example of a duty cycle of the reception data varied due to the degradation of the reception data. In the example shown in FIG. 1, synchronization with the reception data is detected at a falling edge of a synchronous clock and the reception data is captured at a rising edge of the synchronous clock. In this case, when the duty cycle of the reception data is varied, difference is generated between a time when data is captured in accordance with the synchronous clock and the rising edge of the reception data. As a result, errors upon capturing the reception data are increased.

In order to resolve such a problem, for example, Japanese Laid-Open Patent Application No. 2004-363833 (Patent Document 1) discloses a reception device capable of readily generating accurate synchronous clocks in a simple structure. Further, Japanese Laid-Open Patent Application No. 2005-192 (Patent Document 2) discloses a data recovery method and a data recovery circuit in which when a frequency of input data is f1 and a frequency of polyphase clocks is f2, f1/f2 bits are extracted averagely from each set of polyphase data and data is restored.

Patent Document 1: Japanese Laid-Open Patent Application No. 2004-363833

Patent Document 2: Japanese Laid-Open Patent Application No. 2005-192

However, the inventions disclosed in Patent Document 1 and Patent Document 2 perform synchronization through comparison of an input signal with the edge of one side of the synchronous clock. Thus, the inventions pose problems as mentioned above in that reception characteristics are degraded when the duty cycle of the input signal is varied.

SUMMARY OF THE INVENTION

It is a general object of the present invention to provide an improved and useful data processing apparatus in which the above-mentioned problems are eliminated.

A more specific object of the present invention is to provide a data processing apparatus that can perform high-precision control on the duty cycle of a binary output prepared by binarizing the input data, appropriately restore the input data, and improve the reception characteristics.

According to one aspect of the present invention, there is provided a data processing apparatus comprising: a binarization unit binarizing input data based on a threshold voltage; a capture unit capturing data from a binary output binarized by the binarization unit; a duty cycle detection unit detecting a duty cycle of the binary output; and a control unit controlling levels of the input data based on the duty cycle detected by the duty cycle detection unit.

In accordance with this configuration, it is possible to perform high-accuracy control on the duty cycle of the binary output prepared by binarizing the input data and improve reception characteristics.

According to another aspect of the present invention, there is provided a data processing apparatus comprising: a binarization unit binarizing input data based on a threshold voltage; a capture unit capturing data from a binary output binarized by the binarization unit; a simulated pulse generation unit generating simulated pulses of the binary output to be captured in the capture unit; a duty cycle detection unit detecting a duty cycle of the simulated pulses generated by the simulated pulse generation unit; and a control unit controlling levels of the input data based on the duty cycle detected by the duty cycle detection unit.

In accordance with this configuration, the simulated pulses are used, so that it is possible to remove distortion of the duty cycle influenced by the capture unit.

According to another aspect of the present invention, in the data processing apparatus, the capture unit may include: a clock generation unit generating clocks for determining a time when data is captured from the binary output binarized by the binarization unit; and a data capture unit capturing data from the binary output in synchronization with the clocks generated by the clock generation unit.

In accordance with this configuration, it is possible to capture the binary output in synchronization with the generated clocks.

According to another aspect of the present invention, in the data processing apparatus, the clock generation unit may generate synchronous clocks synchronized with the binary output binarized by the binarization unit.

In accordance with this configuration, it is possible to capture data in synchronization with the binary output.

According to another aspect of the present invention, in the data processing apparatus, the capture unit may include: a polyphase clock generation unit generating polyphase clocks for determining a time when data is captured from the binary output binarized by the binarization unit; a polyphase data capture unit capturing polyphase data from the binary output in synchronization with the polyphase clocks generated by the polyphase clock generation unit; and a data recovery unit restoring the data captured from the binary output using the polyphase clocks generated by the polyphase clock generation unit and the polyphase data captured by the polyphase data capture unit.

In accordance with this configuration, the data is restored based on the polyphase data, so that it is possible to restore the data in a more accurate manner.

According to another aspect of the present invention, there is provided a data processing apparatus comprising: a binarization unit binarizing input data based on a threshold voltage; a capture unit capturing data from a binary output binarized by the binarization unit; an average value detection unit detecting an average value of the binary output; and a control unit controlling levels of the input data based on the average value detected by the average value detection unit.

In accordance with configuration, it is possible to control the duty cycle using the average value.

According to another aspect of the present invention, in the data processing apparatus, the capture unit may include: a polyphase clock generation unit generating polyphase clocks for determining a time when data is captured from the binary output binarized by the binarization unit; and a polyphase data capture unit capturing polyphase data from the binary output in synchronization with the polyphase clocks generated by the polyphase clock generation unit, and the average value detection unit may detect an average value of the polyphase data captured by the polyphase data capture unit.

In accordance with this configuration, the duty cycle is controlled using the average value of the polyphase data, so that it is possible to restore the data in a more accurate manner.

According to another aspect of the present invention, the data processing apparatus may include: a D/A conversion unit receiving an output signal of the control unit, wherein the average value detection unit and the control unit are configured using a digital circuit, and the threshold voltage is controlled based on an analog value signal converted by the D/A conversion unit.

In accordance with this configuration, the circuit used for control is digitized, so that it is possible to reduce a circuit size and power consumption.

According to another aspect of the present invention, in the data processing apparatus, the control unit may control the levels of the input data such that the duty cycle is 50%.

In accordance with this configuration, it is possible to realize improvement in the reception characteristics especially at a physical layer of PCI Express known as a major standard of high-speed serial transmission.

According to another aspect of the present invention, in the data processing apparatus, the binarization unit may include: a differential amplifier circuit receiving the input data; a variable current source connected to an output of the differential amplifier circuit; and an amplitude-limiting unit limiting amplitude of a voltage at a connection point between the output of the differential amplifier circuit and the variable current source.

In accordance with this configuration, by changing a current value using the variable current source, the levels of the input data output from the differential amplifier circuit are controlled. And, constant-current characteristics of the variable current source are secured using the amplitude-limiting unit.

According to the present invention, it is possible to perform high-accuracy control on the duty of the binary output prepared by binarizing the input data, appropriately restore the input data, and improve the reception characteristics.

Other objects, features and advantage of the present invention will become more apparent from the following detailed description when read in conjunction with the accompanying drawings.

BRIEF DESCRIPTION OF THE DRAWINGS

FIG. 17 is a diagram showing an example of a functional block diagram of a data processing apparatus 200D according to embodiment 5;

FIG. 22 is a diagram showing an example of a functional block diagram of a data processing apparatus 200G according to embodiment 8.

DETAILED DESCRIPTION OF THE PREFERRED EMBODIMENTS

A data processing apparatus according to the present invention binarizes input data based on a threshold voltage and binary output is prepared. Data is captured from the prepared binary output. The data processing apparatus according to the present invention includes a duty cycle detection unit detecting a duty cycle of the binary output and controls levels of the input data based on the duty cycle detected by the duty cycle detection unit.

[Embodiment 1]

In the following, embodiment 1 of the present invention is described with reference to the drawings.

Figure 1:
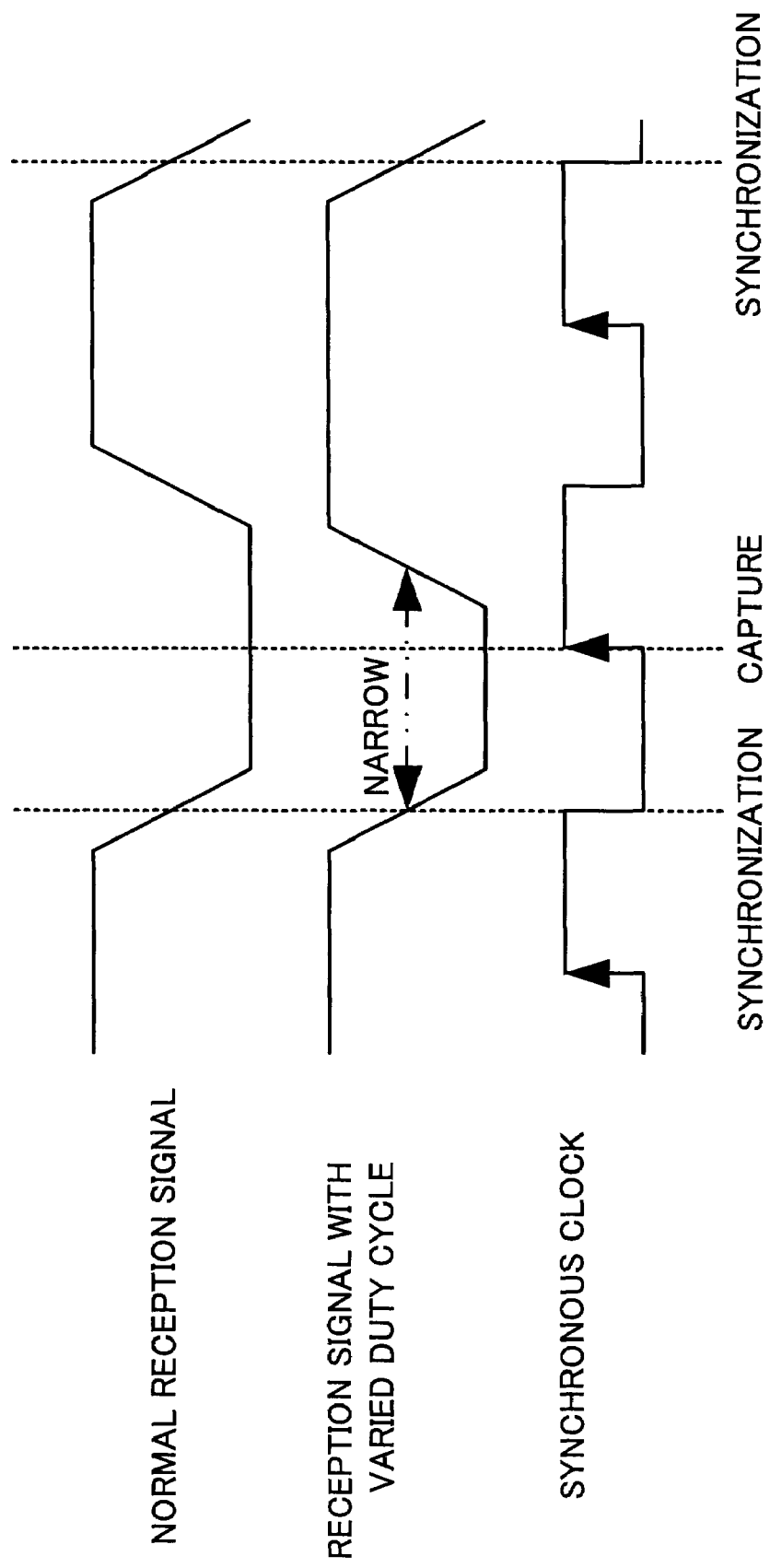
FIG. 1 is a diagram showing an example of a duty cycle of reception data varied due to degradation of reception data.
Figure 2:
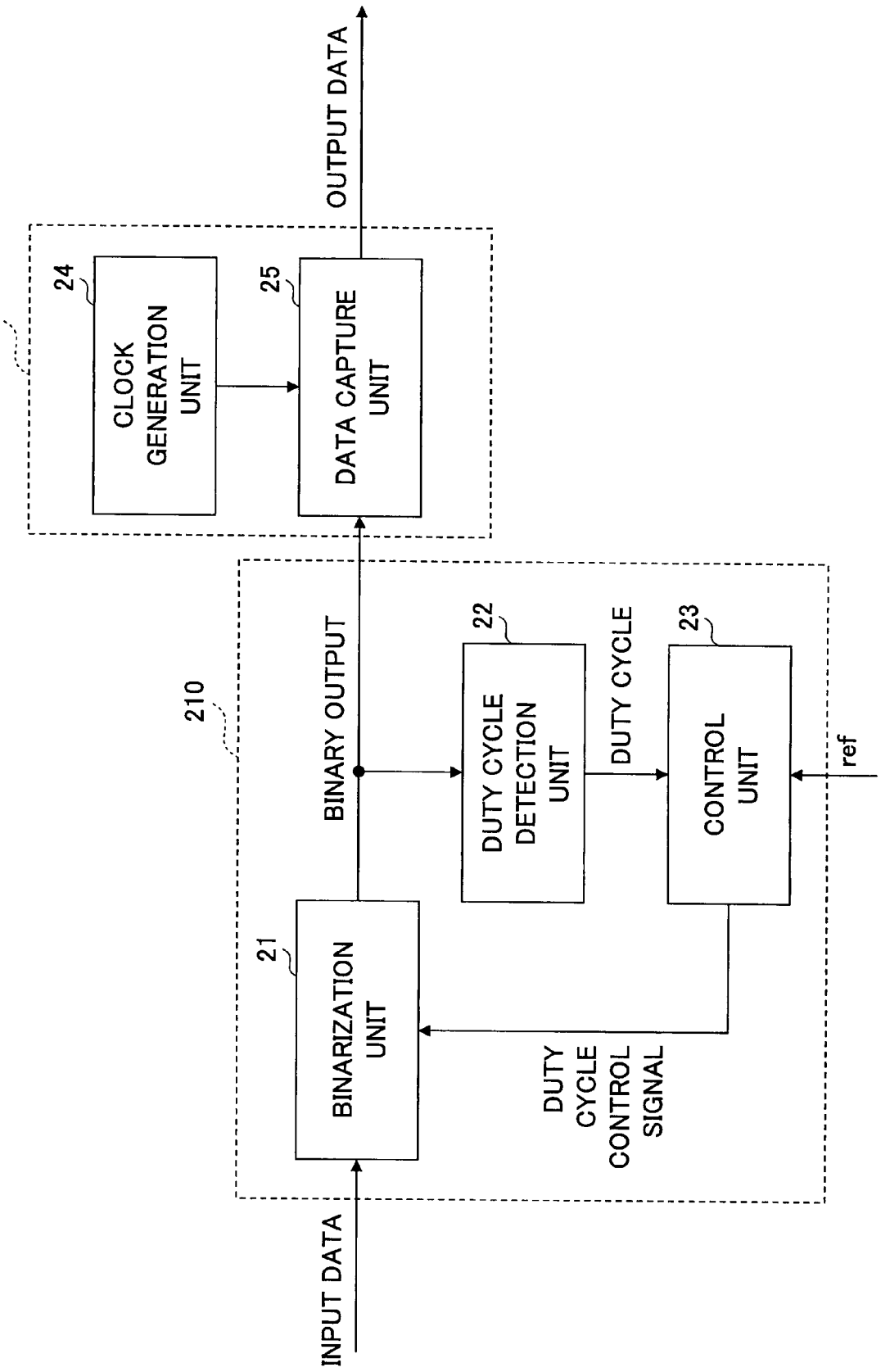
FIG. 2 is a diagram showing an example of a functional block diagram of a data processing apparatus 200 according to embodiment 1.

FIG. 2 is a diagram showing an example of a functional block diagram of a data processing apparatus 200 according to embodiment 1. The data processing apparatus 200 includes a binarization control unit 210 and a capture unit 220. In the binarization control unit 210 of the data processing apparatus 200, the input data is binarized and output as a binary output. In the capture unit 220, data is captured from the binary output.

The data processing apparatus 200 transmits the data captured by the capture unit 220 to an external device connected to the data processing apparatus 200 in an appropriate method. The data processing apparatus 200 may handle data provided based on a high-speed serial transmission method such as PCI Express, S-ATA, or the like as input data. The data processing apparatus 200 may operate at the physical layer of PCI Express, for example. In this case, the external device to which the data is transmitted may operate at a higher layer of the physical layer.

The binarization control unit 210 includes a binarization unit 21, a duty cycle detection unit 22, and a control unit 23. In the binarization control unit 210, the duty cycle detection unit 22 detects a duty cycle of the binary output that is output from the binarization unit 21. The control unit 23 compares the detected duty cycle with a reference value set in the control unit 23 in advance, and then the control unit 23 provides a difference obtained as a result of the comparison to the binarization unit 21 as a duty cycle control signal. The binarization unit 21 controls levels of the input data before the binarization based on the duty cycle control signal.

In this manner, the data processing apparatus 200 constitutes a negative feedback loop. For example, when open-loop gain of this negative feedback loop is K, a steady-state error in the data processing apparatus 200 is controlled to be 1/(K+1). Thus, the open-loop gain K is preferably high so as to perform high-precision control and gain of the control unit 23 is preferably high for the high-precision control. The control unit 23 will be described later.

Figure 3:
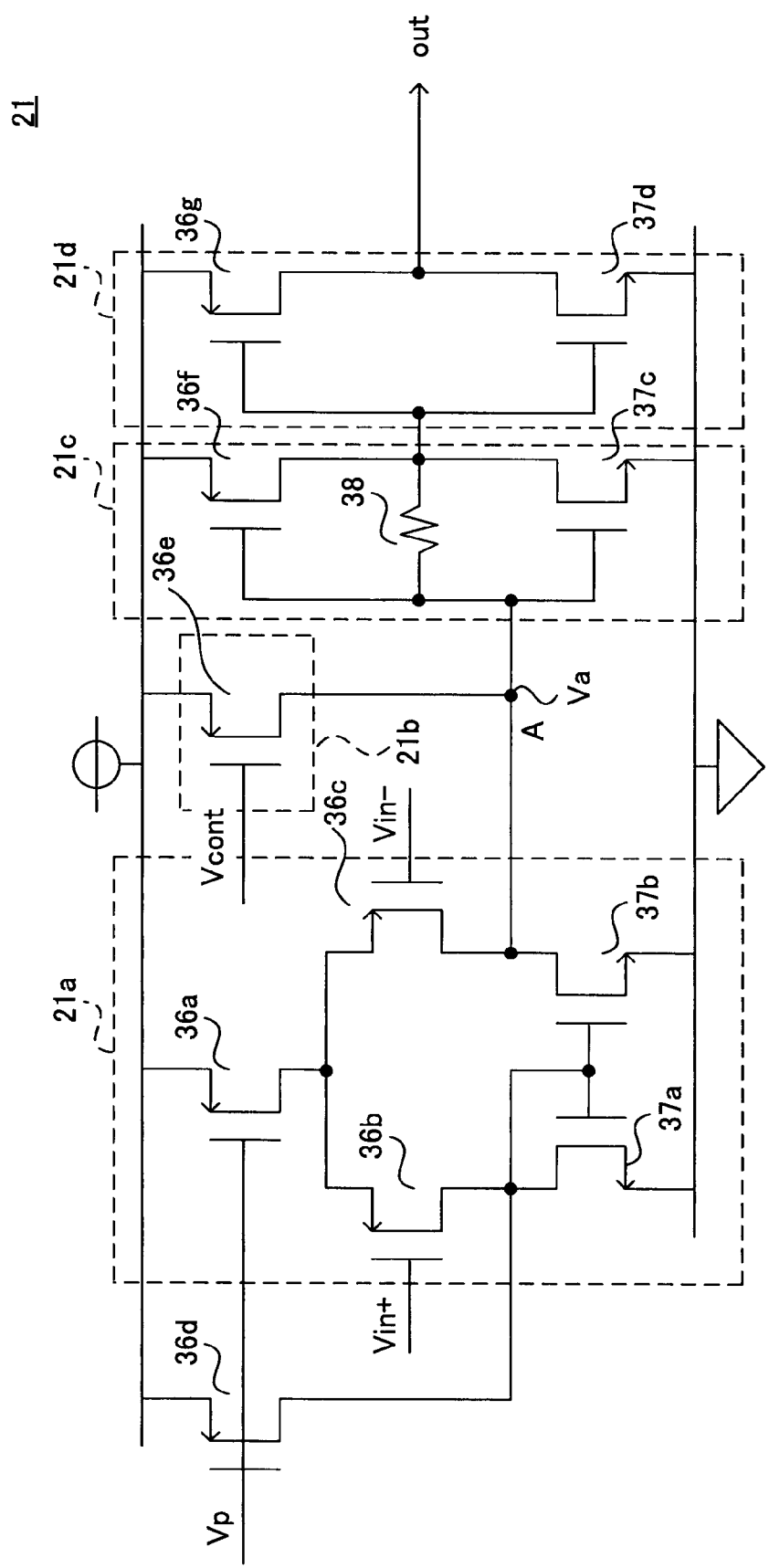
FIG. 3 is a diagram showing an example of a circuit configuration of a binarization unit 21.

In the following, the binarization unit 21 is described with reference to FIG. 3. FIG. 3 is a diagram showing an example of a circuit configuration of the binarization unit 21.

The binarization unit 21 includes a differential amplifier circuit 21a, a level control unit 21b, inverter circuits 21c and 21d.

The input data is applied to the differential amplifier circuit 21a and a voltage corresponding to the input data is output. The voltage output from the differential amplifier circuit 21a is level controlled at a connection point A by the level control unit 21b. Then, the level controlled voltage is binarized in accordance with a threshold voltage included in the inverter circuit 21c and further inverted and amplified by the inverter circuit 21d. In the binarization unit 21, the input data is binarized in this manner.

The binarization unit 21 includes PMOS transistors 36a to 36d, NMOS transistors 37a to 37d, and a resistance 38. In the binarization unit 21, the differential amplifier circuit 21a includes the PMOS transistors 36a, 36b, and 36c and the NMOS transistors 37a and 37b. The level control unit 21b includes a variable current source using a PMOS transistor 36e. The inverter circuit 21c includes a PMOS transistor 36f and an NMOS transistor 37c. The inverter circuit 21d includes a PMOS transistor 36g and an NMOS transistor 37d. The resistance 38 has one end connected to the connection point A and the other end connected to an output of the inverter circuit 21c, so that negative feedback is applied to the connection point A.

In the following, connection of each element constituting the binarization unit 21 is described.

Sources of the PMOS transistors 36a to 36g are commonly connected to a power supply. Sources of the NMOS transistors 37a to 37d are commonly connected to ground. A fixed voltage Vp is applied to gates of the PMOS transistors 36a and 36d and the PMOS transistors 36a and 36d operate as constant current sources. A drain of the PMOS transistor 36d is connected to a connection point between the PMOS transistor 36b and the NMOS transistor 37a and to a commonly connected gate between the NMOS transistor 37a and the NMOS transistor 37b.

The input data to be input to the binarization unit 21 is applied as differential signals Vin+ and Vin− to gates of the PMOS transistors 36b and 36c, respectively. Differential signals are amplified and output as an output of the differential amplifier circuit 21a from a connection point between the PMOS transistor 36c and the NMOS transistor 37b.

A drain of the PMOS transistor 36e and one end of the resistance 38 are connected to the connection point A between the PMOS transistor 36c and the NMOS transistor 37b. Further, a commonly connected gate of the PMOS transistor 36f and the NMOS transistor 37c is connected to the connection point A and the output of the differential amplifier circuit 21a is input to the inverter circuit 21c. Functions of the resistance 38 are described in detail later.

A duty cycle control signal Vcont supplied from the control unit 23 is applied to a gate of the PMOS transistor 36e constituting the level control unit 21b. The PMOS transistor 36e is described in detail later.

The other end of the resistance 38 and a commonly connected gate of the PMOS transistor 36g and the NMOS transistor 37d are connected to a connection point between a drain of the PMOS transistor 36f and a drain of the NMOS transistor 37c. A binarized binary output is output as an output of the binarization unit 21 from a connection point between a drain of the PMOS transistor 36g and a drain of the NMOS transistor 37d.

In the following, the PMOS transistor 36e is described.

The PMOS transistor 36e constitutes the variable current source realizing the level control unit 21b controlling levels of an output voltage of the differential amplifier circuit 21a. The duty cycle control signal Vcont is applied to the gate of the PMOS transistor 36e and a drain current value of the PMOS transistor 36e is varied in accordance with a change of the duty cycle control signal Vcont. When the drain current is varied, a source-drain voltage of the PMOS transistor 36e is changed accordingly. In the level control unit 21b, a voltage of the connection point A is controlled in accordance with the change of the source-drain voltage of the PMOS transistor 36e.

In the binarization unit 21, a voltage Va of the connection point A whose levels are controlled in this manner is binarized in accordance with the threshold voltage included in the inverter circuit 21c and further inverted and amplified by the inverter circuit 21d.

In other words, in the binarization unit 21, the levels of the input data before being binarized in the inverter circuit 21c are controlled in accordance with the duty cycle control signal so as to control the duty cycle when the input data is binarized.

In addition, although the inverter circuits include two stages following the differential amplifier circuit 21a in the present embodiment, the number of stages is not limited to this and four stages of inverter circuits may be disposed, for example.

Figure 4:
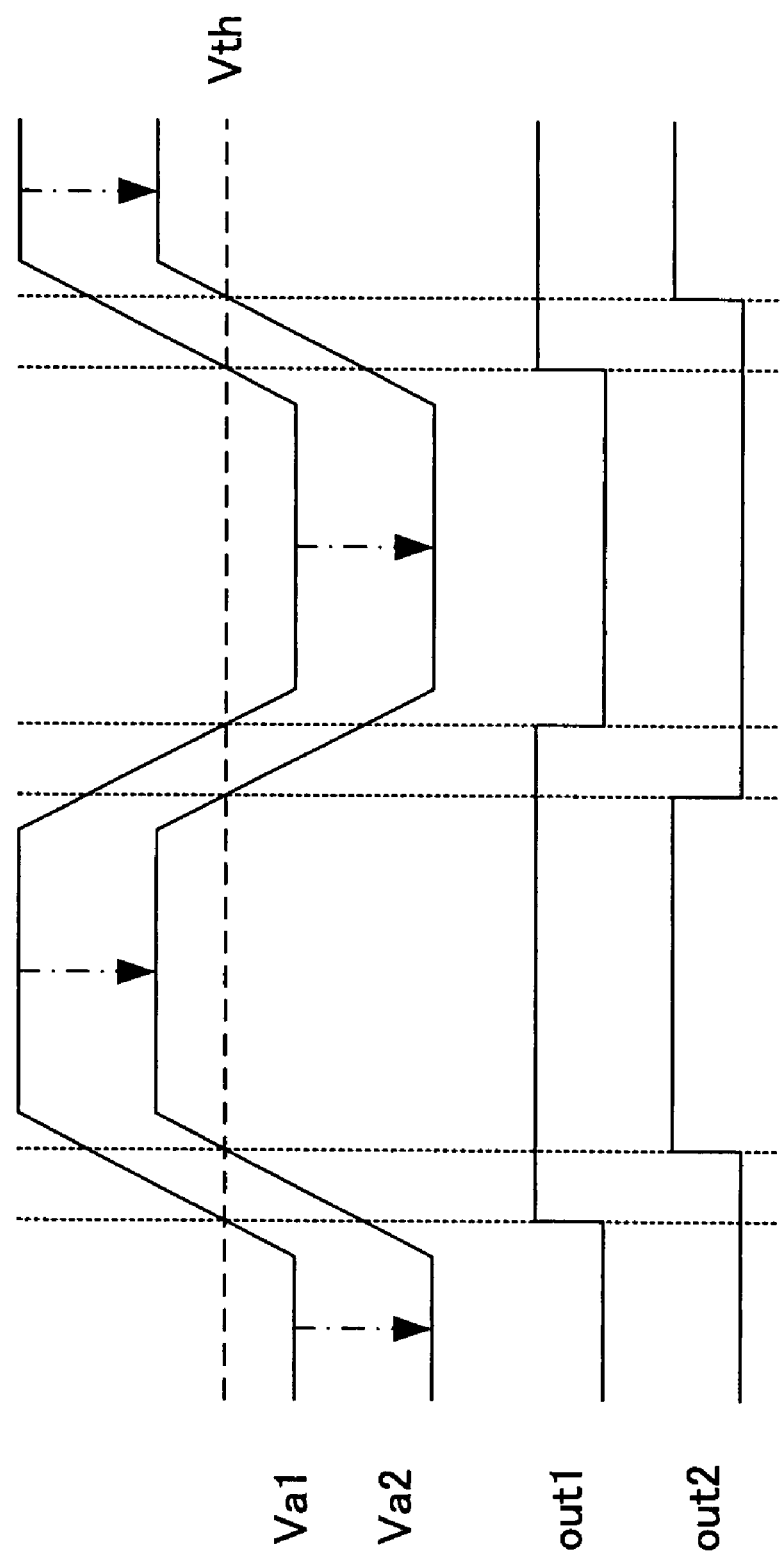
FIG. 4 is a diagram illustrating level control of a voltage Va at a connection point A and duty cycle control.

In the following, the level control of the voltage Va at the connection point A and the duty cycle control are described with reference to FIG. 4. FIG. 4 is a diagram illustrating the level control of the voltage Va at the connection point A and the duty cycle control.

In FIG. 4, a voltage of the connection point A before the level control is Va1 and a voltage of the connection point A after the level control is Va2. Binary outputs prepared by binarizing the voltage Va1 and the voltage Va2 using a threshold voltage Vth are out1 and out2, respectively. As shown in FIG. 4, when the voltage Va1 is changed to the voltage Va2, the binary output out1 is changed to the binary output out2, so that it is understood that the duty cycle of the binary output is changed.

In this manner, by controlling the levels of the voltage Va of the connection point A as an output voltage of the differential amplifier circuit 21*a* using the duty cycle control signal Vcont, it is possible to control the duty cycle when the input data input to the binarization unit 21 is binarized and output.

Next, the resistance 38 is described with reference to FIG. 3.

In the inverter circuit 21*c*, the resistance 38 is disposed as an amplitude control unit controlling voltage amplitude of the voltage Va of the connection point A. The resistance 38 has one end connected to the connection point A and the other end connected to the connection point between the drain of the PMOS transistor 36*f* and the drain of the NMOS transistor 37*c*. The output of the inverter circuit 21*c* is returned to the connection point A via the resistance 38, so that it is possible to control the voltage amplitude of the connection point A.

Figure 5:
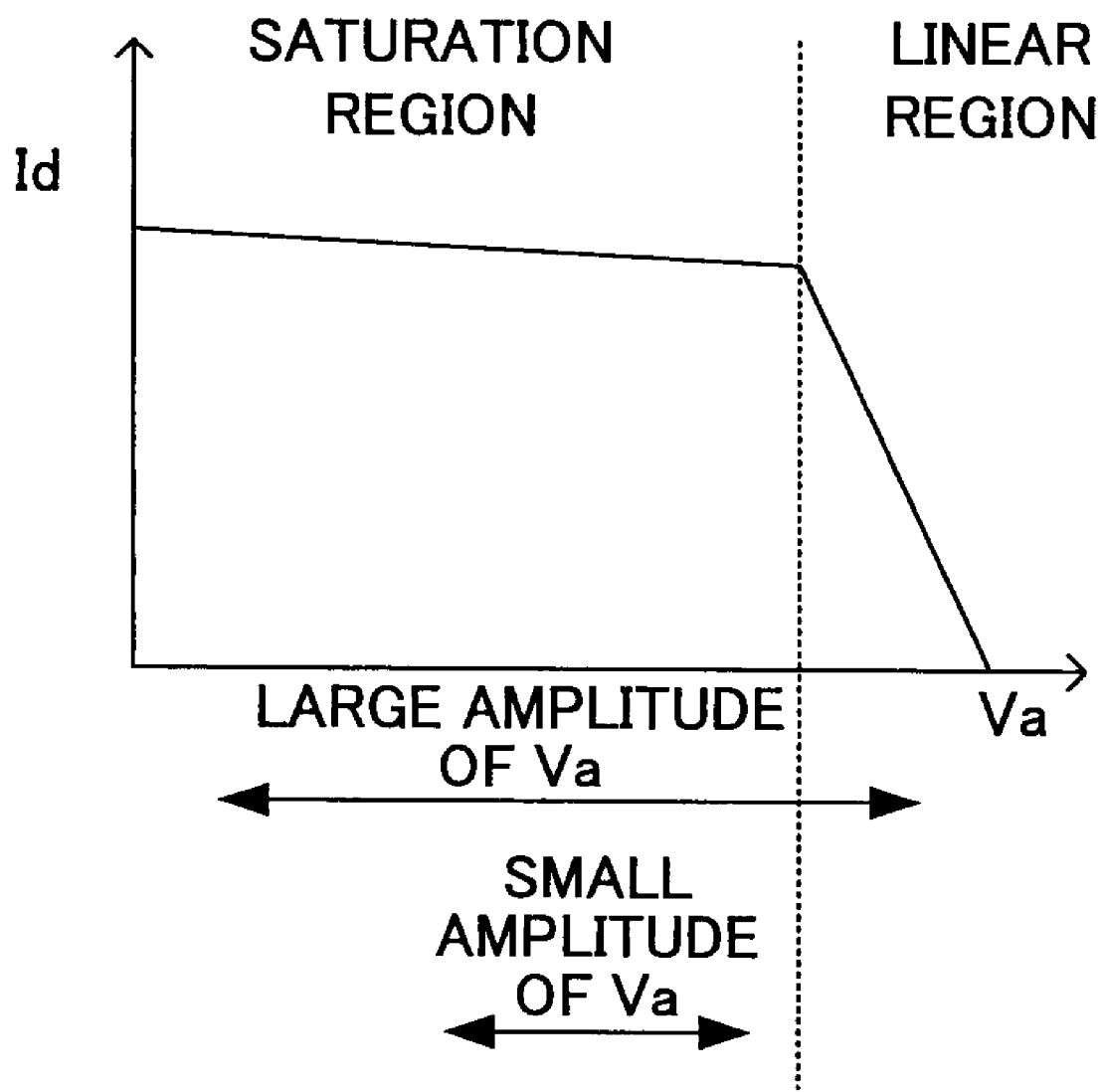
FIG. 5 is a diagram illustrating a drain current Icont of a PMOS transistor 36e supporting the voltage Va.

In the following, the amplitude of the voltage Va is described with reference to FIG. 5. FIG. 5 is a diagram illustrating a drain current Icont of the PMOS transistor 36*e* supporting the voltage Va.

When a threshold voltage of the PMOS transistor 36*e* is Vth1, a gate-source voltage is Vgs, a drain-source voltage is Vds, and a drain current is Id, the PMOS transistor 36*e* performs operation in a saturation region when Vds>(Vgs−Vth1). Thus, the drain current Id is substantially constant in the saturation region as shown in FIG. 5. Further, when Vds<(Vgs−Vth1), the PMOS transistor 36*e* performs operation in a linear region and the drain current Id is represented by a linear function of the drain-source voltage Vds. Thus, the drain current Id in the linear region is represented by the linear function as shown in FIG. 5.

In this case, when the amplitude of the voltage Va of the connection point A is increased, the voltage Va being obtained as the output of the differential amplifier circuit 21*a*, the drain-source voltage Vds is temporarily expressed as Vds<(Vgs−Vth1) in the vicinity of a maximum value of the voltage amplitude, for example. In this case, the PMOS transistor 36*e* performs operation between the saturation region and the linear region. Thus, constant-current characteristics of the drain current Id of the PMOS transistor 36*e* are eliminated and accuracy of the duty cycle control is reduced.

In the present embodiment, the amplitude of the voltage Va of the connection point A is limited using the resistance 38, so that the PMOS transistor 36*e* is allowed to perform operation always in the saturation region. This prevents the situation as mentioned above and realizes duty cycle control with higher accuracy.

In addition, in view of the facts that standard values for power supply voltage in a CMOS process have been lowered in recent years and voltage is lowered due to current applied to circuits, it is difficult to secure constant-current characteristics of transistors. For example, in a 1.2 V process, the power supply voltage is considered to be lowered to about 900 mV. In this case, the amplitude of voltage allowed for securing the constant-current characteristics of the PMOS transistor 36*e* is about 200 mV at the connection point A.

In the following, the duty cycle detection unit 22 is described.

Figure 6:
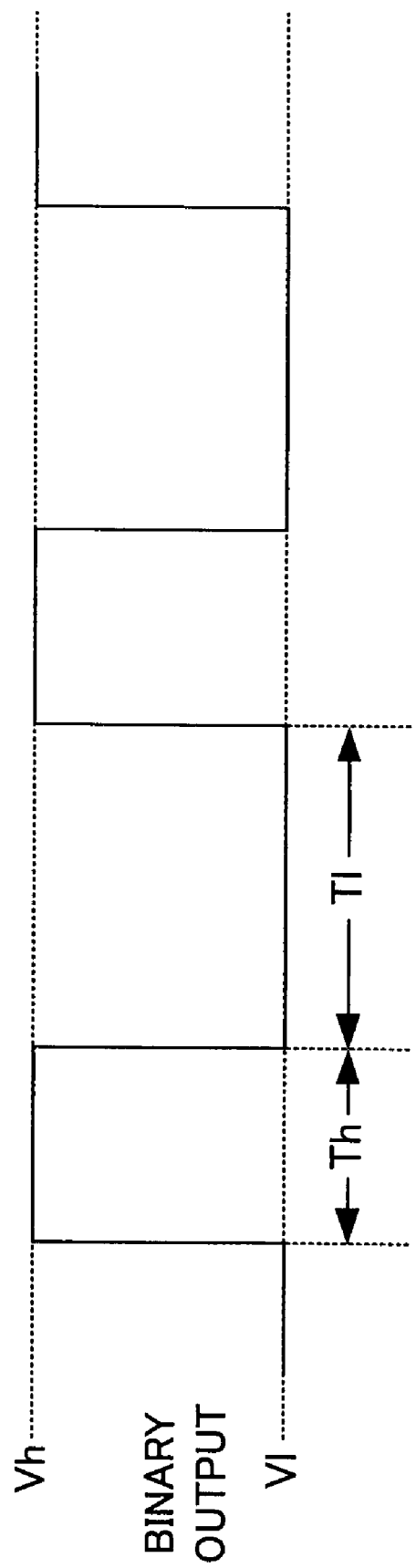
FIG. 6 is a diagram illustrating detection of a duty cycle of a binary output.

The duty cycle detection unit 22 in the present embodiment may be realized by using a low-pass filter, for example. In the following, the duty cycle detection of the binary output in the duty cycle detection unit 22 is described with reference to FIG. 6. FIG. 6 is a diagram illustrating the duty cycle detection of the binary output.

In FIG. 6, Vh is the output of the binary output that is output from the binarization unit 21 in a case of a high level (hereafter referred to as an H level) and Th is a pulse length. Vl is the output of the binary output in a case of a low level (hereafter referred to as an L level) and Tl is the pulse length.

Based on this, the duty cycle of the binary output shown in FIG. 6 is expressed as duty=Th/(Th+Tl). In this case, an average value of the binary output is expressed as:

$$(Th \times Vh + Tl \times V1)/(Th + Tl) = Th/(Th + Tl) \times (Vh - V1) + V1 \quad \text{[Formula 1]}$$
$$= \text{duty} \times (Vh - V1) + V1$$

Thus, in the duty cycle detection unit 22, the duty cycle of the binary output is detected from the average value of the binary output and the pulse values when the binary output is in the H level and in the L level.

Next, the control unit 23 is described. Based on a result of comparison of the duty cycle detected in the duty cycle detection unit 22 with the reference value set in advance in the control unit 23, the control unit 23 outputs a duty cycle control signal for controlling the duty cycle. Details of the reference value are described later. The control unit 23 in the present embodiment may be realized by using a general comparator. The duty cycle control signal is applied to the gate of the PMOS transistor 36*e* of the binarization unit 21 as mentioned above.

As mentioned above, in the binarization control unit 210 of the present embodiment, the duty cycle of the binary output of the input data is detected and the duty cycle is compared with the reference value set in advance. Then, based on the result of this comparison, the duty cycle upon binarizing the input data is changed, so that it is possible to control the duty cycle to be a desired value with high accuracy.

In the following, the reference value used for controlling the duty cycle is described. In the control unit 23, the reference value is set in advance such that the duty cycle is 50%. By controlling the duty cycle of the input data to be 50% in this manner, it is possible to improve reception characteristics in 8b/10b conversion and the like widely known as a high-speed serial transmission method, for example.

Many high-speed serial transmission standards in recent years employ a method in which data to be transmitted is subjected to the 8b/10b conversion before the transmission. In the 8b/10b conversion, 8 bit data to be transmitted is converted to 10 bit data in accordance with a conversion table. By embedding a clock in serial data, the data and the clock are transmitted using a single signal. Further, in the 8b/10b conversion, by limiting a frequency band in which the data is transmitted, the clock embedding is readily performed. And, by having the same number for the H level and the L level included in the transmitted data, data patterns are created without generating level fluctuation of data.

In the data converted through such an 8b/10b conversion, the numbers of the H level and the L level are the same as mentioned above, so that the duty cycle of the transmitted data is 50%. In other words, in the data processing apparatus 200 of the present embodiment, when data converted through the 8b/10b conversion is input, the duty cycle of the input data is 50%. Thus, by controlling the duty cycle of the binary output of the input data to be 50% in the binarization unit 21, it is possible to capture the input data in an accurate manner.

Figure 7:
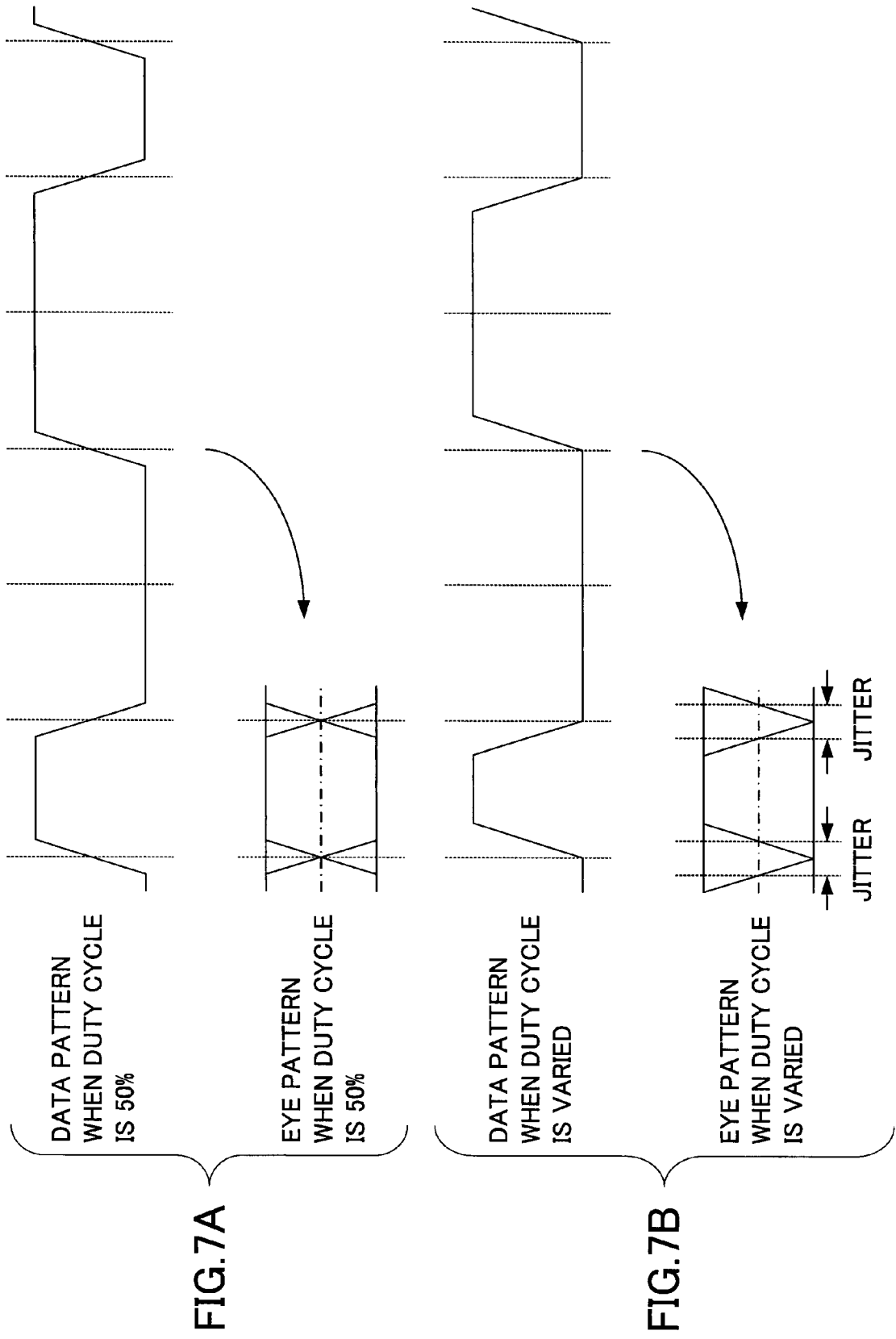
FIG. 7A is a diagram illustrating a case where a duty cycle of input data is 50%.
FIG. 7B is a diagram illustrating a case where a duty cycle of input data is varied from 50%.

In the following, a case where the duty cycle of the input data is varied from 50% is described with reference to FIGS. 7A and 7B. FIGS. 7A and 7B are diagrams illustrating the case where the duty cycle of the input data is varied from 50%.

FIG. 7A shows a data pattern when the duty cycle is 50% and an eye pattern of the data pattern. FIG. 7B shows a data pattern when the duty cycle is varied from 50% and an eye pattern of the data pattern. The eye pattern shown in FIG. 7B is narrowed in comparison with the eye pattern shown in FIG. 7A, so that jitter is generated accordingly and reception characteristics are degraded.

In the present embodiment, the reference value of the control unit 23 is set such that the duty cycle of the binary output is 50%, so that it is possible to obtain signals with reduced jitter upon capturing data and to improve the reception characteristics.

Next, the capture unit 220 is described. The capture unit 220 of the present embodiment includes a clock generation unit 24 and a data capture unit 25.

The clock generation unit 24 is for generating clocks for determining a time when data is captured from the binary output that is output from the binarization unit 21. The clock generation unit 24 may be realized by using a PLL (Phase Locked Loop) circuit, for example.

The data capture unit 25 captures the data from the binary data output from the binarization unit 21 in synchronization with the clocks generated by the clock generation unit 24. The data capture unit 25 of the present embodiment may be realized by using a flip-flop circuit, for example. The data capture unit 25 of the present embodiment captures the data at a rising edge of the clock and stores the captured data.

Figure 8:
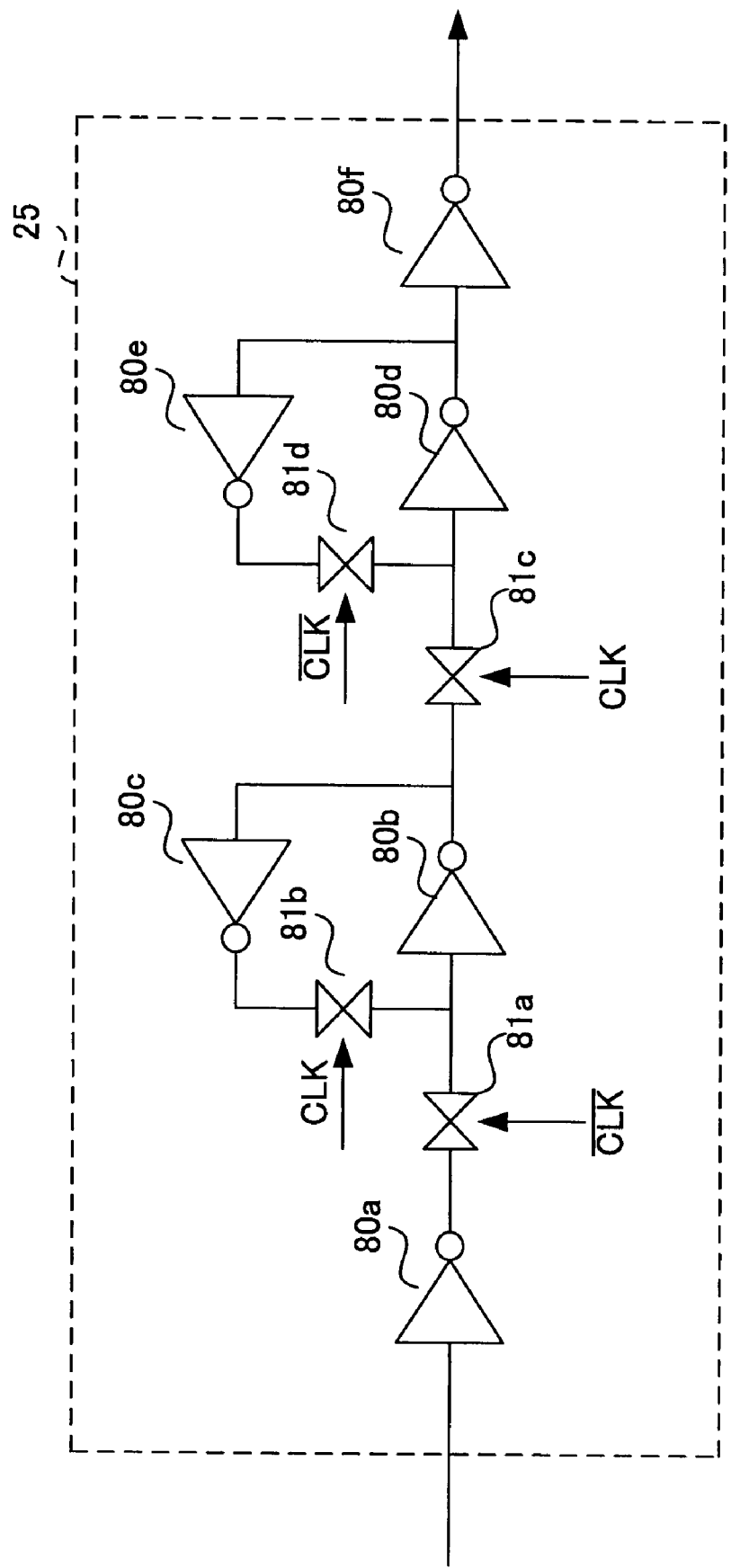
FIG. 8 is a diagram showing an example of a circuit configuration of a flip-flop circuit.

In the following, the flip-flop circuit realizing the data capture unit 25 is described with reference to FIG. 8. FIG. 8 is a diagram showing an example of a circuit configuration of the flip-flop circuit.

The flip-flop circuit constituting the data capture unit 25 includes MOS inverters 80a to 80f and MOS switches 81a to 81d to which the clocks generated in the clock generation unit 24 are input.

In the data capture unit 25, when the clock supplied from the clock generation unit 24 is in the L level, the MOS switches 81a and 81d are switched on and the MOS switches 81b and 81c are switched off. Then, the data capture unit 25 captures the data from the binary output via the MOS inverter 80a and stores the data in the data capture unit 25.

When the clock supplied from the clock generation unit 24 is in the H level, the MOS switches 81a and 81d are switched off and the MOS switches 81b and 81c are switched on. Then, the data capture unit 25 outputs the data via the MOS inverter 80f, the data being stored in the data capture unit 25.

In this manner, the flip-flop circuit constituting the data capture unit 25 of the present embodiment captures the data from the binary output in synchronization with the rising edge of the clock supplied form the clock generation unit 24. Then, the data captured by the data capture unit 25 is output to an external device as output data of the data processing apparatus 200.

As mentioned above, in the present embodiment, it is possible to control the duty cycle of the binary output with high accuracy, appropriately restore the input data, and improve the reception characteristics.

[Embodiment 2]

Figure 9:
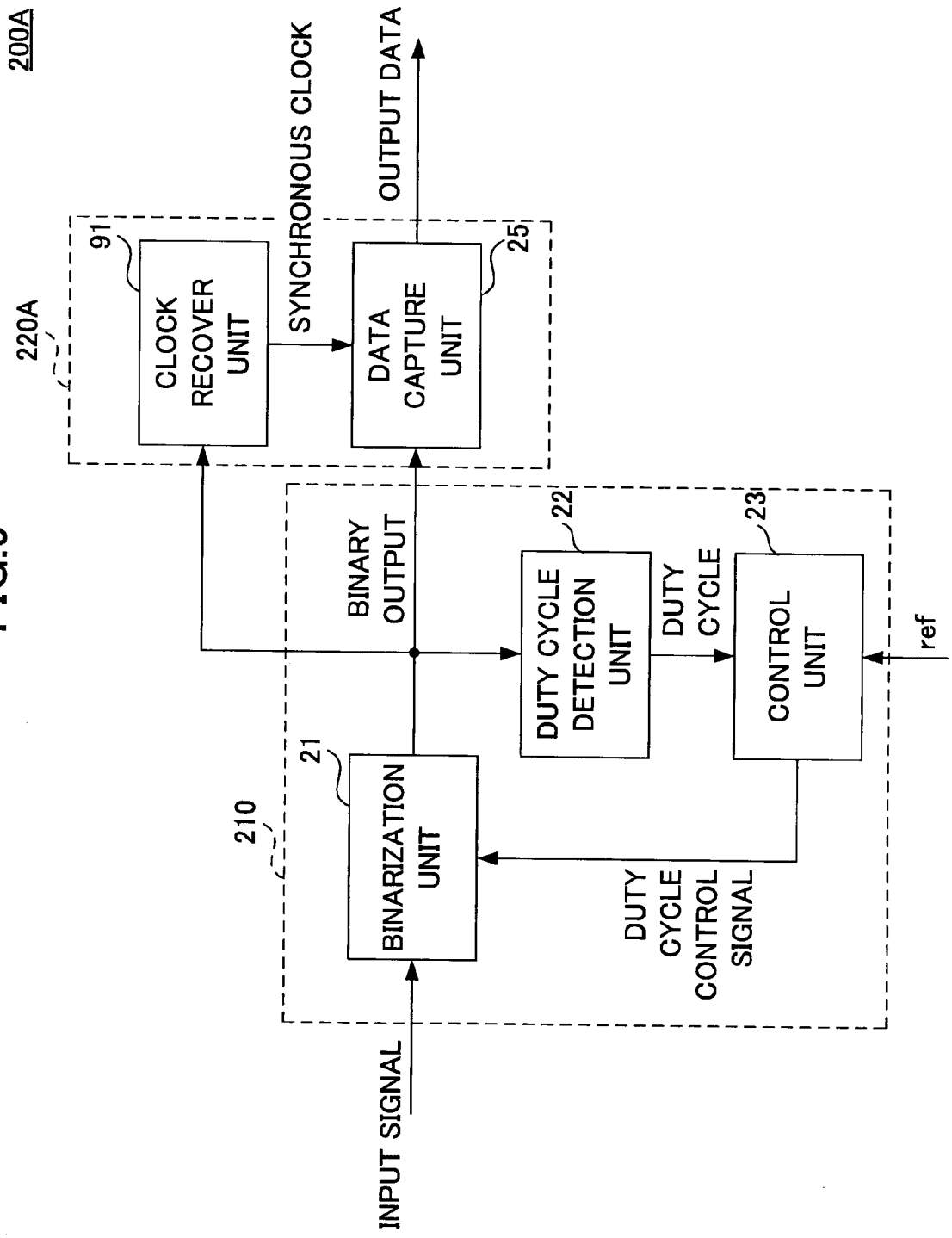
FIG. 9 is a diagram showing an example of a functional block diagram of a data processing apparatus 200A according to embodiment 2.

In the following, embodiment 2 of the present invention is described. FIG. 9 is a diagram showing an example of a functional block diagram of a data processing apparatus 200A according to embodiment 2. The data processing apparatus 200A is different from embodiment 1 in that a clock recovery unit 91 is disposed as the clock generation unit 24 of the above-mentioned embodiment 1. Thus, elements or portions in FIG. 9 having the same functions or configurations as in embodiment 1 are provided with the same reference numerals used for describing embodiment 1 and description of those elements or portions is omitted.

A capture unit 220A of embodiment 2 includes the clock recovery unit 91 and the data capture unit 25. The clock recovery unit 91 obtains the binary output from the binarization unit 21, generates synchronous clocks synchronized with the binary output, and supplies the synchronous clocks to the data capture unit 25. The data capture unit 25 captures the data from the binary output in synchronization with the synchronous clocks.

Figure 10:
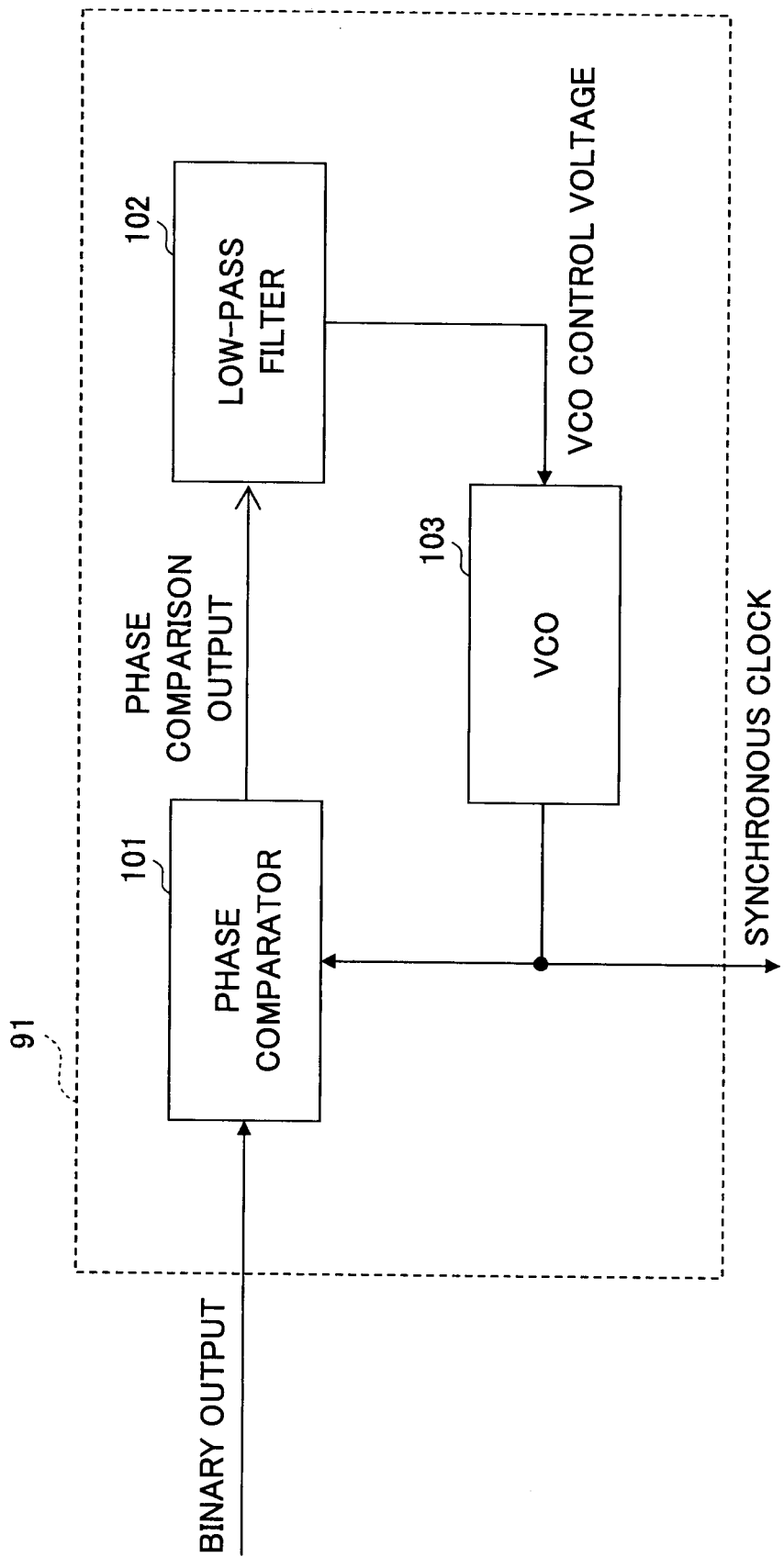
FIG. 10 is a diagram showing an example of a circuit configuration of a clock recovery unit 91.

In the following, the clock recovery unit 91 is described with reference to FIG. 9. FIG. 10 is a diagram showing an example of a circuit configuration of the clock recovery unit 91 in the present embodiment.

The clock recovery unit 91 is realized by using a PLL circuit. The clock recovery unit 91 includes a phase comparator 101, a low-pass filter 102, and a voltage-controlled oscillator (hereafter referred to as VCO) 103.

The phase comparator 101 compares an output of the VCO 103 with the binary output in terms of phase difference and outputs a result of the comparison. The low-pass filter 102 performs filtering on the output result and outputs a result of the filtered output as a frequency control voltage. The VCO 103 outputs clocks having a frequency determined in accordance with the frequency control voltage. In this case, the clocks output from the VCO 103 are synchronous clocks synchronized with the binary output.

In accordance with this configuration, in the present embodiment, the data capture unit 25 captures data from the binary output in synchronization with the binary output, so that it is possible to capture binarized input data in an accurate manner.

[Embodiment 3]

Figure 11:
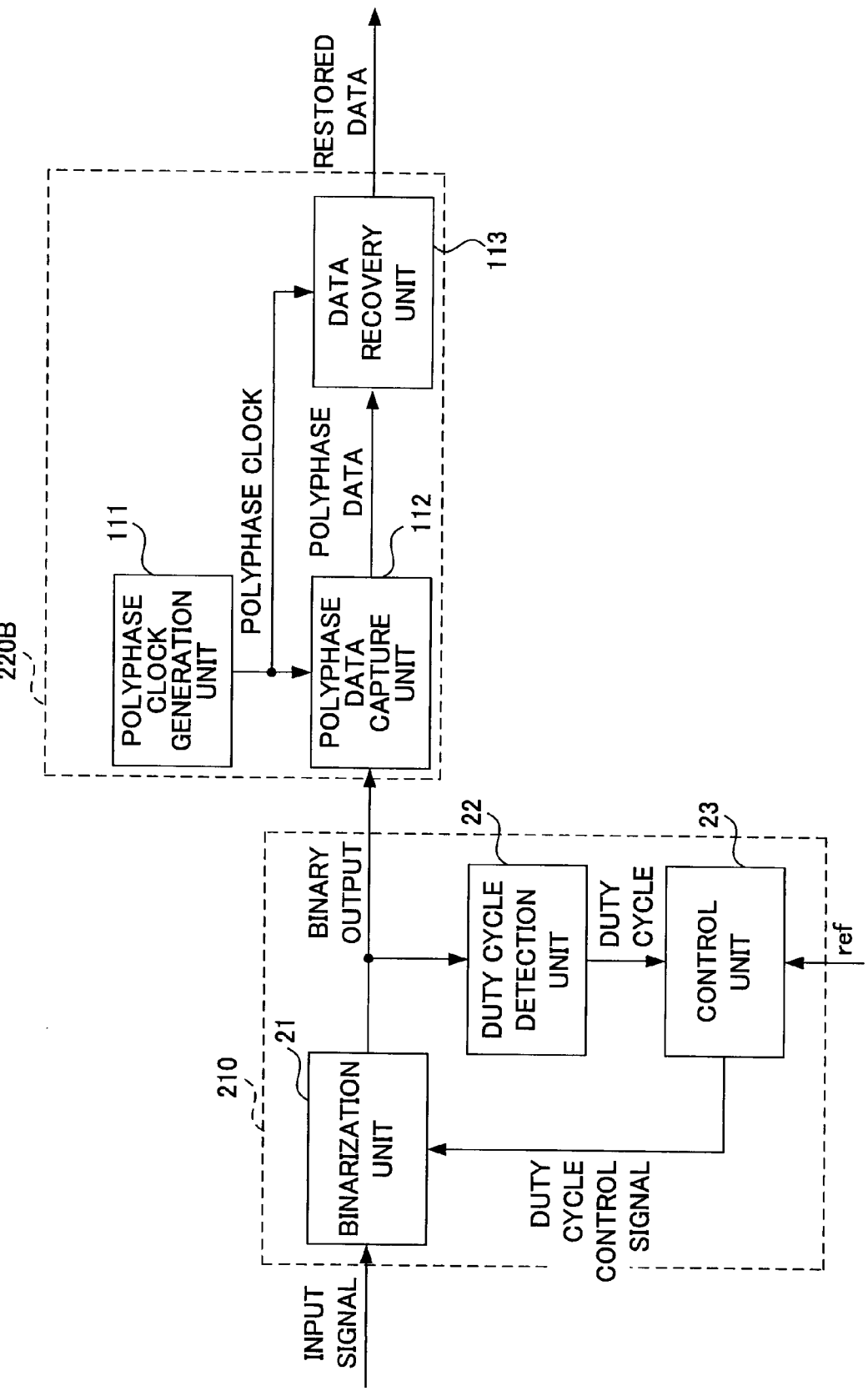
FIG. 11 is a diagram showing an example of a functional block diagram of a data processing apparatus 200B according to embodiment 3.

In the following, embodiment 3 of the present invention is described with reference to the drawings. FIG. 11 is a diagram showing an example of a functional block diagram of a data processing apparatus 200B according to embodiment 3. The data processing apparatus 200B is different from embodiment 1 only in a configuration of a capture unit 220B. Thus, elements or portions in FIG. 11 having the same functions or configurations as in embodiment 1 are provided with the same reference numerals used for describing embodiment 1 and description of those elements or portions is omitted.

The capture unit 220B includes a polyphase clock generation unit 111, a polyphase data capture unit 112, and a data recovery unit 113.

A polyphase clock generation unit 111 generates polyphase clocks and supplies the generated polyphase clocks to the polyphase data capture unit 112 and the data recovery unit 113. The polyphase data capture unit 112 obtains polyphase data from the binary output in synchronization with the polyphase clocks and outputs the obtained polyphase data as polyphase data. The data recovery unit 113 restores the input data using the polyphase data and the polyphase clocks and outputs the restored data as output data of the data processing apparatus 200B.

Figure 12:
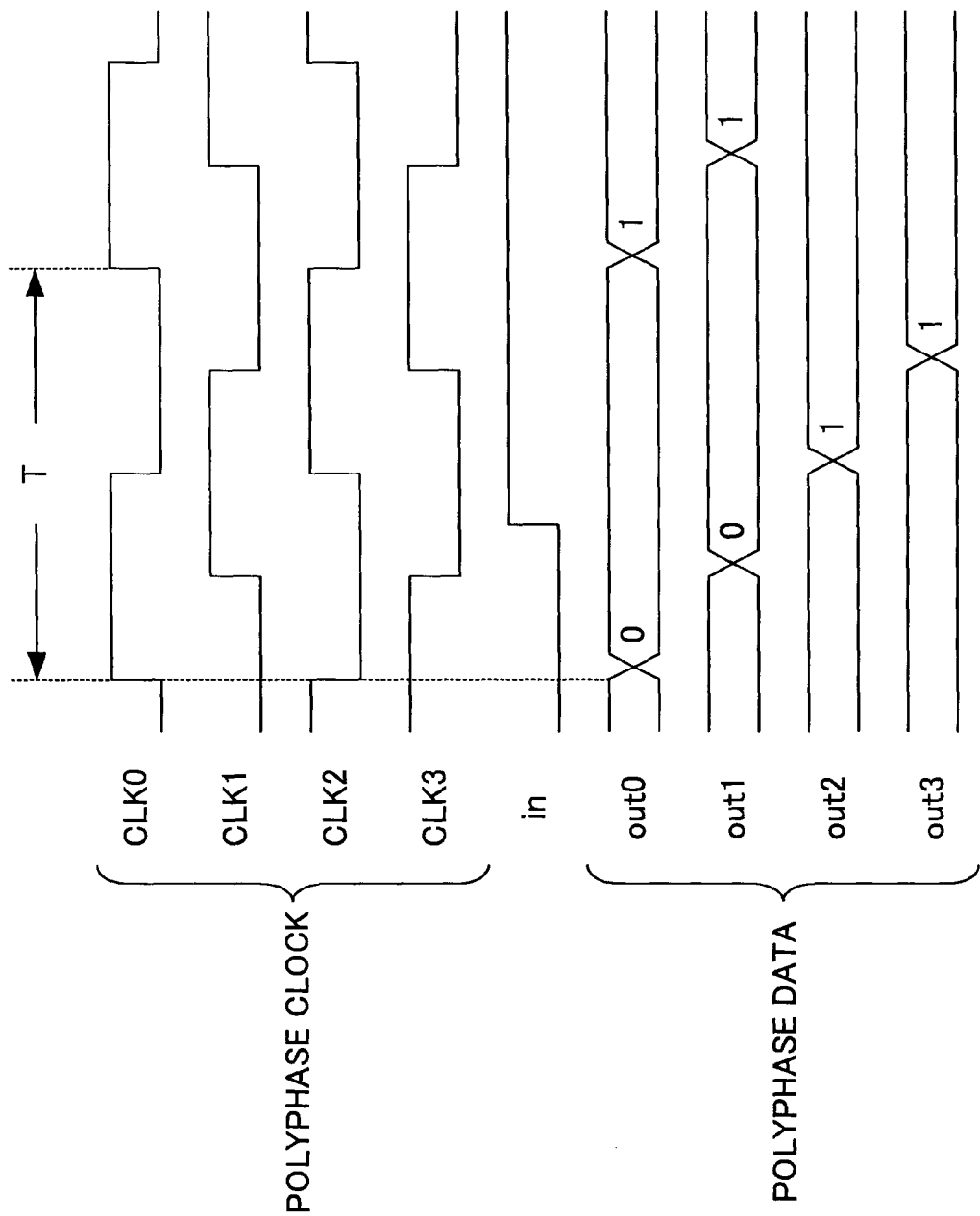
FIG. 12 is a diagram showing an example of a time chart of polyphase clocks and polyphase data.

In the following, capturing of data in synchronization with the polyphase clocks is described with reference to FIG. 12. FIG. 12 is a diagram showing an example of a time chart of polyphase clocks and polyphase data. In FIG. 12, the polyphase clocks are referenced at CLK0 to CLK3, the binary output is referenced at in, the polyphase data is referenced at out1 to out3. In the present embodiment, the polyphase clock generation unit 111 is assumed to generate four-phase clocks and the polyphase data capture unit 112 is assumed to capture data at the rising edge of the polyphase clock. As shown in FIG. 12, when data is captured at the rising edges of the polyphase clocks of four phases, it is possible to obtain polyphase data of four phases each being synchronized with one of the polyphase clocks and having different phase.

Figure 13:
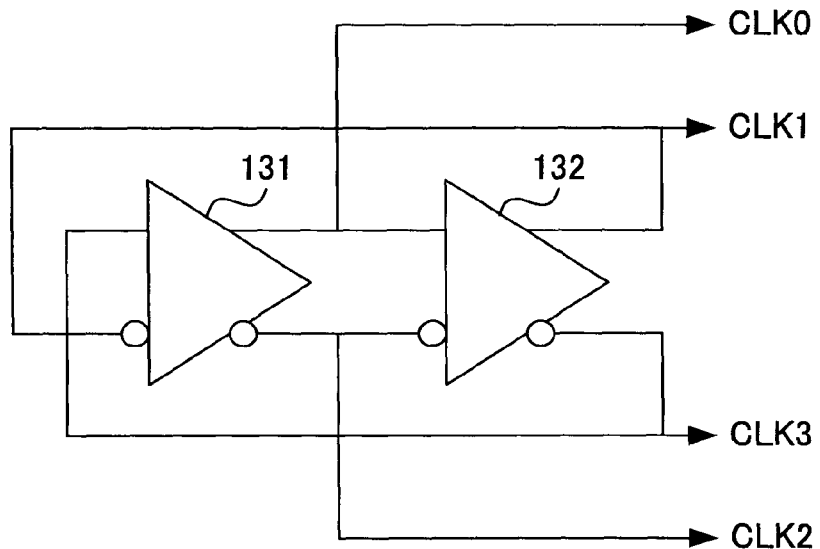
FIG. 13 is a diagram showing an example of a circuit configuration of a polyphase clock generation unit 111.

Next, the polyphase clock generation unit 111 is described with reference to FIG. 13. FIG. 13 is a diagram showing an example of a circuit configuration of the polyphase clock generation unit 111. The polyphase clock generation unit 111 may be realized by using a ring oscillator employing differential amplifiers 131 and 132. When a cycle is T and the number of phases is P, this ring oscillator is capable of generating P polyphase clocks whose phases are shifted by T/P relative to one another. In addition, as mentioned above, the number of phases P is four in the present embodiment.

Figure 14:
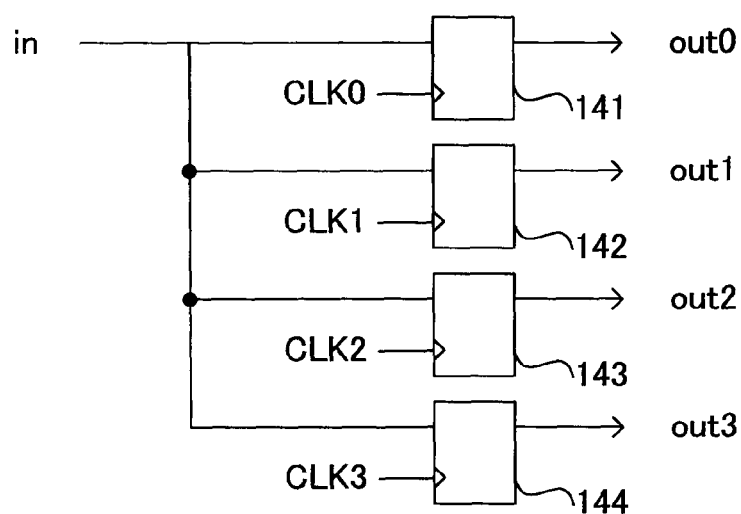
FIG. 14 is a diagram showing an example of a circuit configuration of a polyphase data capture unit 112.

Next, the polyphase data capture unit 112 is described with reference to FIG. 14. FIG. 14 is a diagram showing an example of a circuit configuration of the polyphase data capture unit 112. As shown in FIG. 14, the polyphase data capture unit 112 of the present embodiment may be realized by connecting flip-flop circuits 141 to 144 in a parallel manner and inputting the polyphase clocks with different phases to each flip-flop circuit as input clocks.

When the input clocks to each flip-flop circuit have phases shifted relative to one another, it is possible to capture data from the binary output at different time in each flip-flop circuit and output the binary output as polyphase data. In addition, each of the flip-flop circuits 141 to 144 may have the same configuration as shown in FIG. 8 described in embodiment 1.

The data recovery unit 113 restores data using the polyphase data output from the polyphase data capture unit 112 and the polyphase clocks. The data recovery unit 113 of the present embodiment may be realized through a method disclosed in Patent Document 2. In other words, when the frequency of the input data is f1 and the frequency of the polyphase clock is f2, the data recovery unit 113 averagely extracts f1/f2 bits from each set of the polyphase data and restores data.

In this manner, in the present embodiment, the polyphase data is captured from the binary output in synchronization with the polyphase clocks and the polyphase data is restored, so that it is possible to restore the input data in a more accurate manner.

[Embodiment 4]

Figure 15:
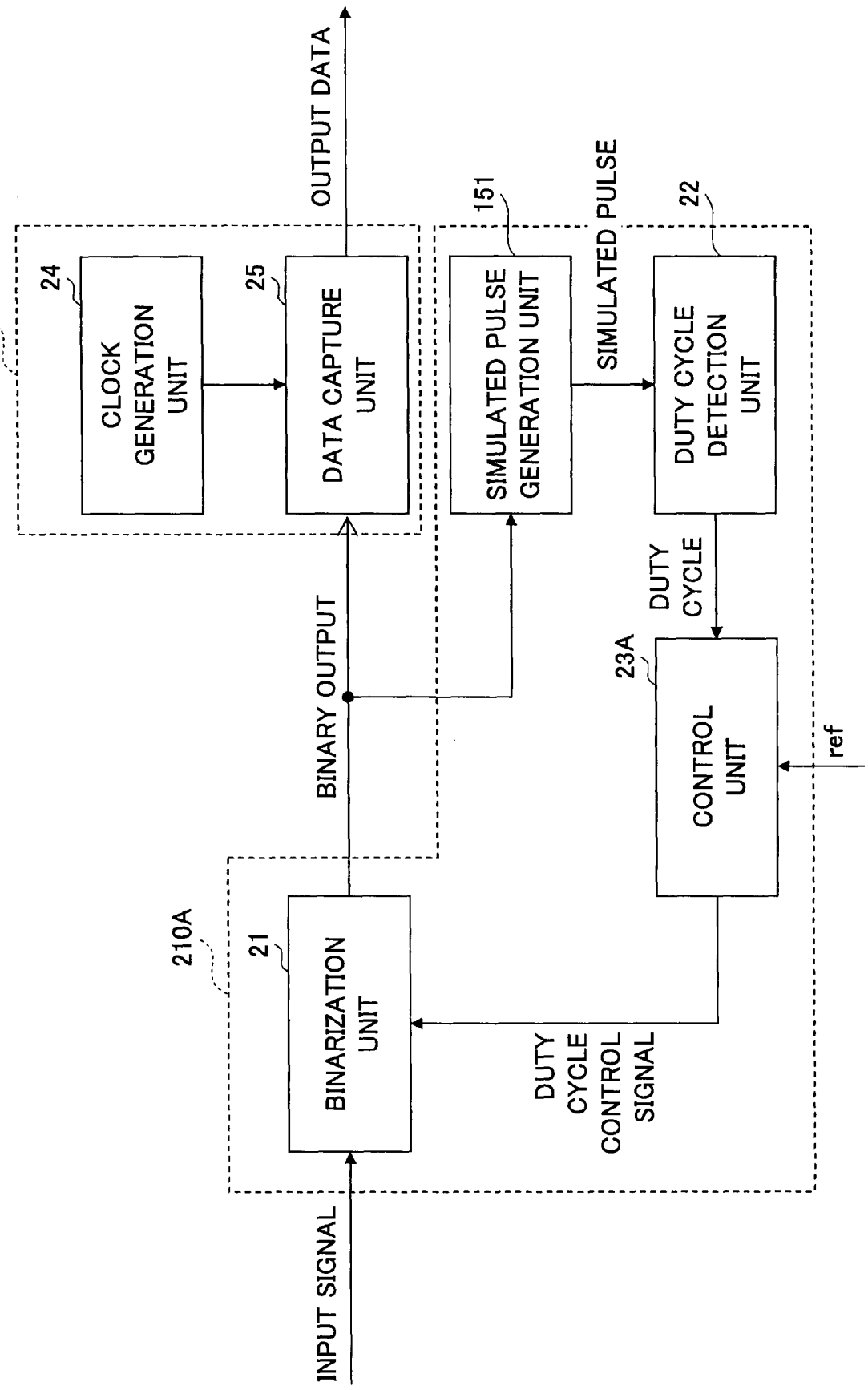
FIG. 15 is a diagram showing an example of a functional block diagram of a data processing apparatus 200C according to embodiment 4.

In the following, embodiment 4 of the present embodiment is described. FIG. 15 is a diagram showing an example of a functional block diagram of a data processing apparatus 200C according to embodiment 4. The data processing apparatus 200C is different from embodiment 1 in that a simulated pulse generation unit 151 is disposed on the binarization control unit 210 of embodiment 1. Thus, elements or portions in FIG. 15 having the same functions or configurations as in embodiment 1 are provided with the same reference numerals used for describing embodiment 1 and description of those elements or portions is omitted.

The binarization control unit 210A of the data processing apparatus 200C includes the binarization unit 21, the duty cycle detection unit 22, the control unit 23, and the simulated pulse generation unit 151.

Figure 16:
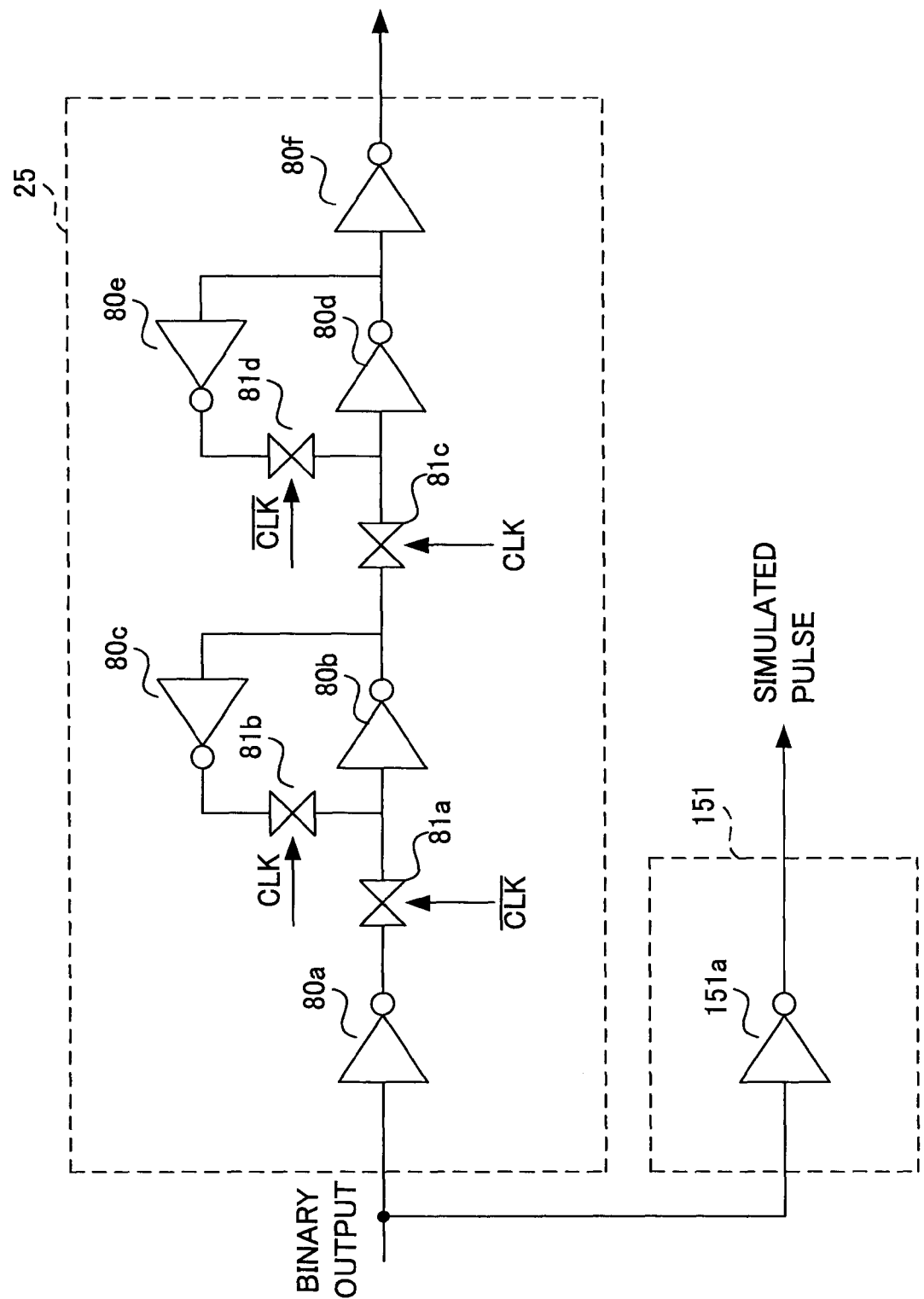
FIG. 16 is a diagram showing an example of a circuit configuration of a simulated pulse generation unit 151.

The simulated pulse generation unit 151 is a circuit prepared by simulating an input portion of the data capture unit 25. In the following, the simulated pulse generation unit 151 is described. FIG. 16 is a diagram showing an example of a circuit configuration of the simulated pulse generation unit 151 in the present embodiment. The simulated pulse generation unit 151 is realized by using an inverter 151a having the same characteristics and the same size as the MOS inverter 80a constituting the data capture unit 25.

A threshold voltage of the MOS inverter 80a in the data capture unit 25 varies in accordance with conditions of the device, temperature, power supply voltage, and the like. Thus, even when the duty cycle of input data is controlled to be a desired value and binary output is prepared, the duty cycle of the binary output supplied to the data capture unit 25 is varied due to the threshold voltage of the MOS inverter 80a constituting the input portion of the data capture unit 25.

In view of this problem, the inverter 151a is disposed as a simulated inverter of the MOS inverter 80a having the same characteristics and the same size as the MOS inverter 80a of the data capture unit 25. When the binary output is input to the inverter 151a and an output therefrom is used as a simulated pulse, it is possible to accurately reproduce the binary output supplied to the data capture unit 25.

Further, by supplying the simulated pulses generated by the inverter 151a to the duty cycle detection unit 22 and controlling the duty cycle of the input data based on the duty cycle of the simulated pulses, it is possible to accurately control the duty cycle of the binary output supplied to the data capture unit 25. Moreover, the simulated pulses generated in the simulated pulse generation unit 151 of the present embodiment have inverted signals relative to the binary output, so that a control unit 23A of the present embodiment has an opposite polarity relative to the control unit 23 of embodiment 1.

When the inverter 151a realizing the simulated pulse generation unit 151 is configured to be an inverter accurately simulating the MOS inverter 80a, preferably, matching properties are secured taking into consideration a shape, a position, and the like in terms of layout on an IC.

As mentioned above, in the present embodiment, the duty cycle of the simulated pulses of the binary output supplied to the data capture unit 25 is controlled, so that it is possible to capture binarized input data in a more accurate manner.

[Embodiment 5]

In the following, embodiment 5 of the present invention is described with reference to the drawings. FIG. 17 is a diagram showing an example of a functional block diagram of a data processing apparatus 200D according to embodiment 5. The data processing apparatus 200D includes the binarization control unit 210A shown in FIG. 15 described in embodiment 4 and the capture unit 220A shown in FIG. 9 described in embodiment 2. Thus, elements or portions in FIG. 17 having the same functions or configurations as in embodiments 2 and 4 are provided with the same reference numerals used for describing embodiments 2 and 4 and description of those elements or portions is omitted.

In the data processing apparatus 200D of embodiment 5, the binarization control unit 210A controls the duty cycle of the input data and outputs the binary output. The capture unit 220A captures data from the binary output.

In accordance with such a configuration, by controlling the duty cycle of the simulated pulses of the binary output supplied to the data capture unit 25, it is possible to capture binarized input data in a more accurate manner. Further, the data capture unit 25 captures data from the binary output in synchronization with the binary output, so that it is possible to capture binarized input data in an accurate manner.

[Embodiment 6]

Figure 18:
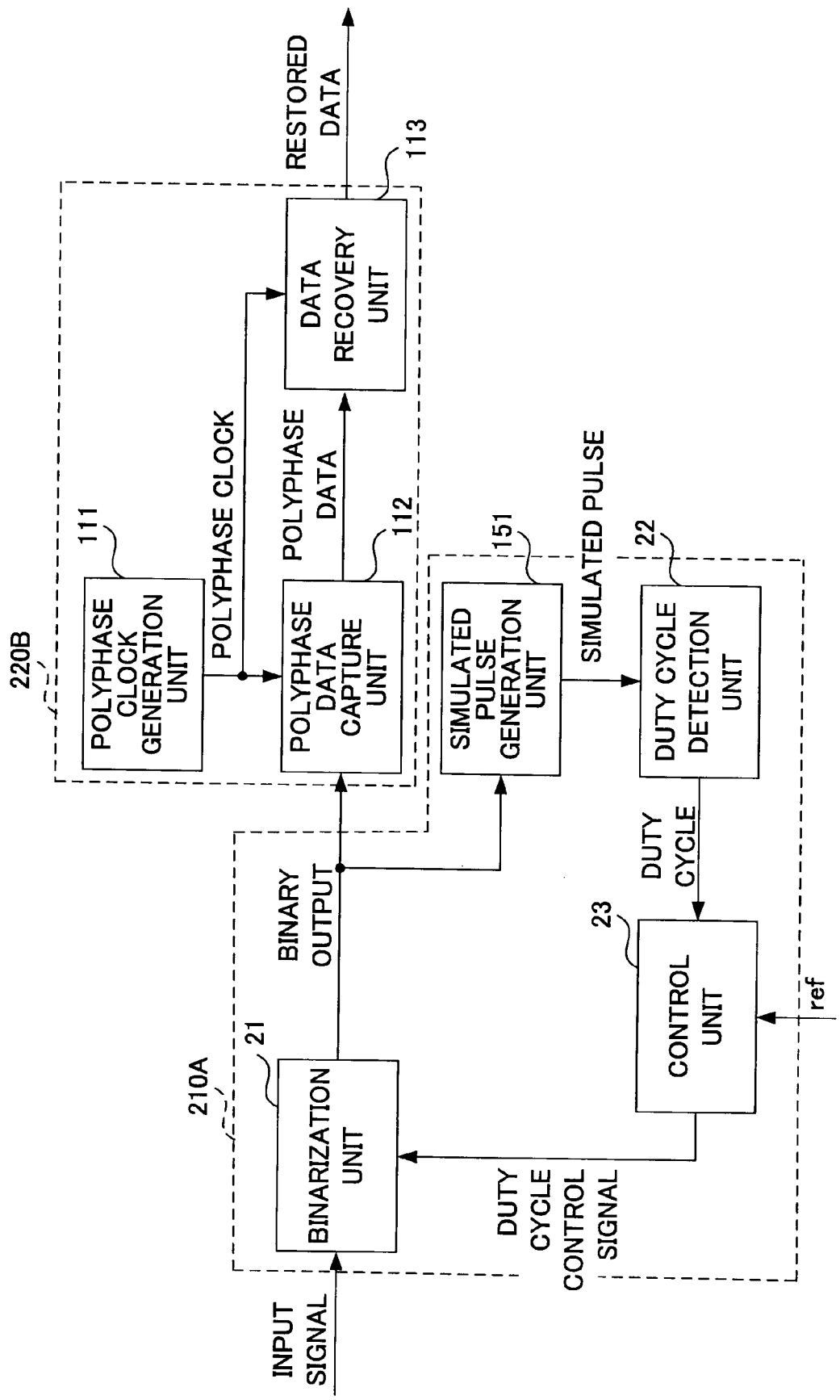
FIG. 18 is a diagram showing an example of a functional block diagram of a data processing apparatus 200E according to embodiment 6.

In the following, embodiment 6 of the present invention is described with reference to the drawings. FIG. 18 is a diagram showing an example of a functional block diagram of a data processing apparatus 200E according to embodiment 6. The data processing apparatus 200E includes the binarization control unit 210A shown in FIG. 15 described in embodiment 4 and the capture unit 220B shown in FIG. 11 described in embodiment 3. Thus, elements or portions in FIG. 18 having the same functions or configurations as in embodiments 3 and 4 are provided with the same reference numerals used for describing embodiments 3 and 4 and description of those elements or portions is omitted.

In the data processing apparatus 200E of embodiment 6, the binarization control unit 210A controls the duty cycle of the input data and outputs the binary output. The capture unit 220B captures data from the binary output.

In accordance with such a configuration, by controlling the duty cycle of the simulated pulses of the binary output supplied to the polyphase data capture unit 112, it is possible to capture binarized input data in a more accurate manner. Further, the polyphase data is captured from the binary output in synchronization with the polyphase clocks and the polyphase data is restored, so that it is possible to restore the input data in a more accurate manner.

[Embodiment 7]

Figure 19:
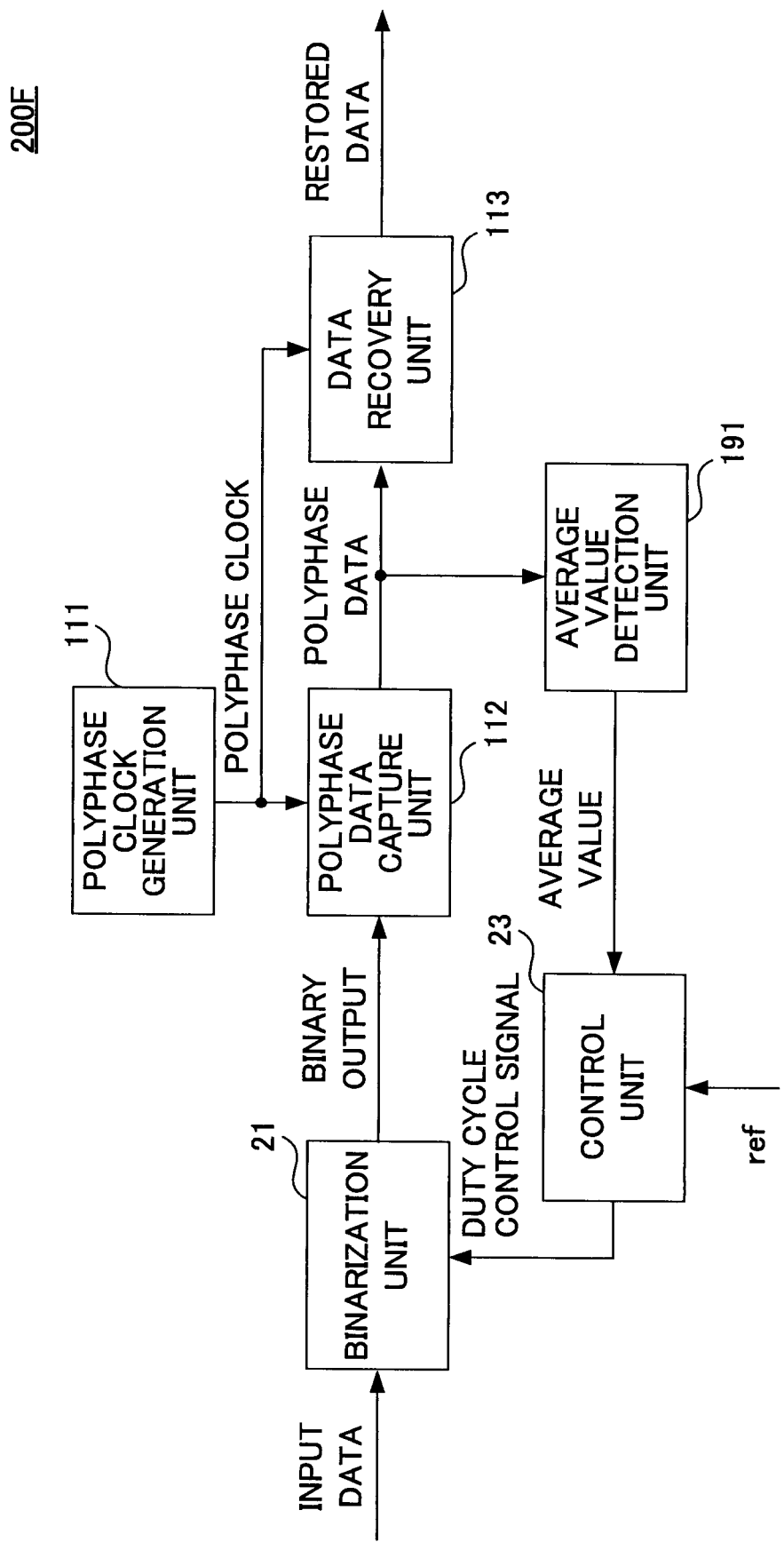
FIG. 19 is a diagram showing an example of a functional block diagram of a data processing apparatus 200F according to embodiment 7.

In the following, embodiment 7 of the present invention is described with reference to the drawings. FIG. 19 is a diagram showing an example of a functional block diagram of a data processing apparatus 200F according to embodiment 7. The data processing apparatus 200F of the embodiment 7 is different from embodiment 3 in that the duty cycle detection unit 22 in the data processing apparatus 200B shown in FIG. 11 described in embodiment 3 is replaced by the average value detection unit 191. Thus, elements or portions in FIG. 19 having the same functions or configurations as in embodiment 3 are provided with the same reference numerals used for describing embodiment 3 and description of those elements or portions is omitted.

The data processing apparatus 200F includes the binarization unit 21, the control unit 23, the polyphase clock generation unit 111, the polyphase data capture unit 112, the data recovery unit 113, and the average value detection unit 191.

The input data is output as the binary output from the binarization unit 21 and the binary output is input to the polyphase data capture unit 112. The polyphase data capture unit 112 captures data captures data from the binary output in synchronization with the polyphase clocks generated by the polyphase clock generation unit 111 and outputs the captured data as polyphase data. The polyphase data capture unit 112 supplies the polyphase data to the data recovery unit 113 and the average value detection unit 191. The data recovery unit 113 restores the input data using the polyphase data and the polyphase clocks. The restored data is output as an output of the data processing apparatus 200F to an external device. The average value detection unit 191 detects an average value of the polyphase data and outputs the detected average value to the control unit 23. The control unit 23 outputs the duty cycle control signal to the binarization unit 21 based on a result of comparison of the average value with the reference value.

Figure 20:
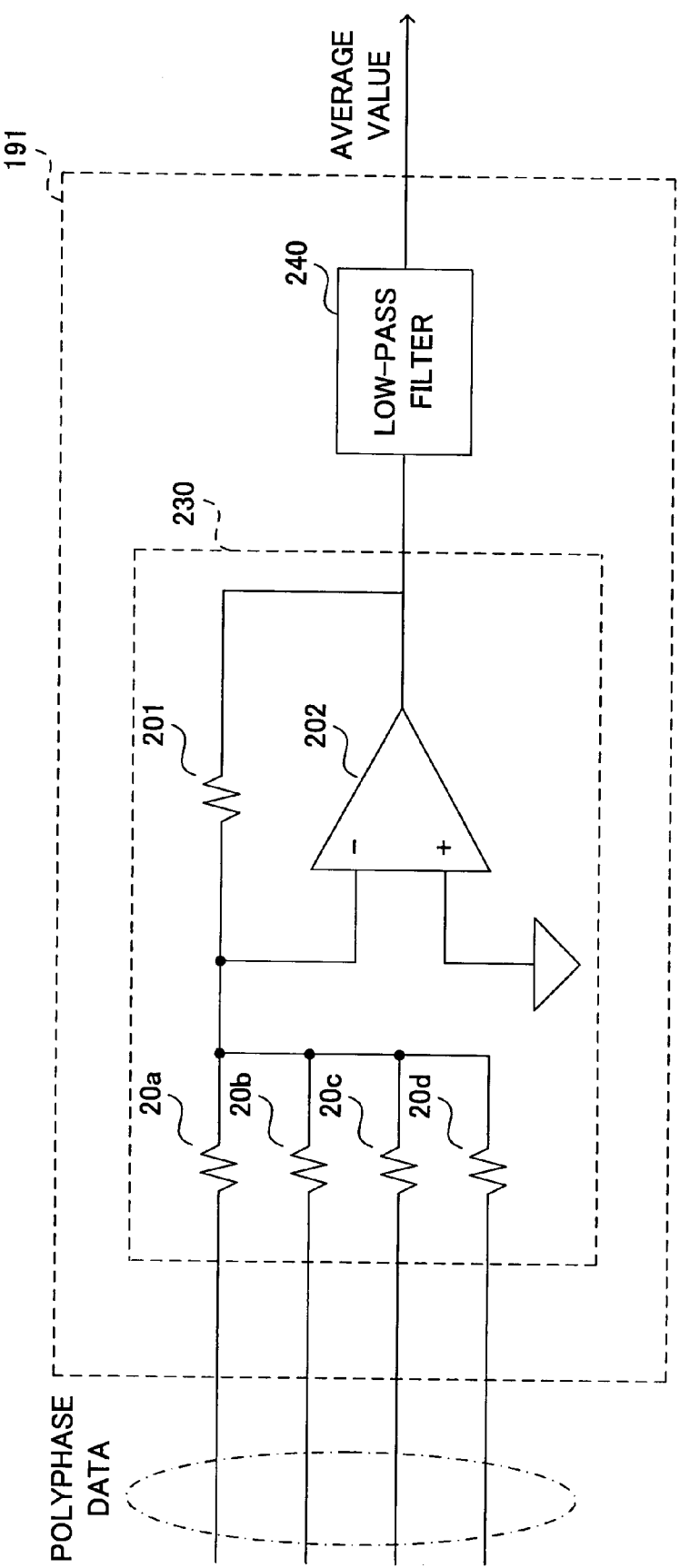
FIG. 20 is a diagram showing an example of a circuit configuration of an average value detection unit 191.

In the following, the average value detection unit 191 of the present embodiment is described. FIG. 20 is a diagram showing an example of a circuit configuration of the average value detection unit 191.

In the average value detection unit 191, a low-pass filter 240 is connected to an adding circuit 230 employing resistances 20a to 20d, a resistance 201, and an operational amplifier 202. The adding circuit 230 may be realized by using a multi-input adder. The adding circuit 230 performs addition on the polyphase data. The average value detection unit 191 detects an average value of the polyphase data by applying the addition result in the adding circuit 230 to the low-pass filter 240. In this case, by setting 1/the number of phases P as weighting of each set of data added in the adding circuit 230, it is possible to adjust the average value output from the average value detection unit 191 within a range from V1 to Vh. In the present embodiment, the number of phases P is four, V1 is a value when the binary output is in the L level, and Vh is a value when the binary output is in the H level. Further, regarding a resistance value of each resistance, when a resistance value of the resistance 20a to 20d is R, a resistance value of the resistance 201 may be R/P, namely, R/4 in the present embodiment.

It is possible to convert the average value detected in this manner to a duty cycle using Formula I described in embodiment 1. Thus, it is possible to control the duty cycle of the binary output using the average value of the polyphase data detected in the present embodiment.

In accordance with such a configuration, the average value of the polyphase data is detected, the duty cycle is calculated from the average value, and the duty cycle control upon binarization of the input data is performed based on the result of the calculated duty cycle. Thus, it is possible to capture the binarized input data in a more accurate manner. Moreover, the polyphase data is captured from the binary output in synchronization with the polyphase clocks and the polyphase data is restored, so that it is possible to restore the input data in a more accurate manner.

Figure 21:
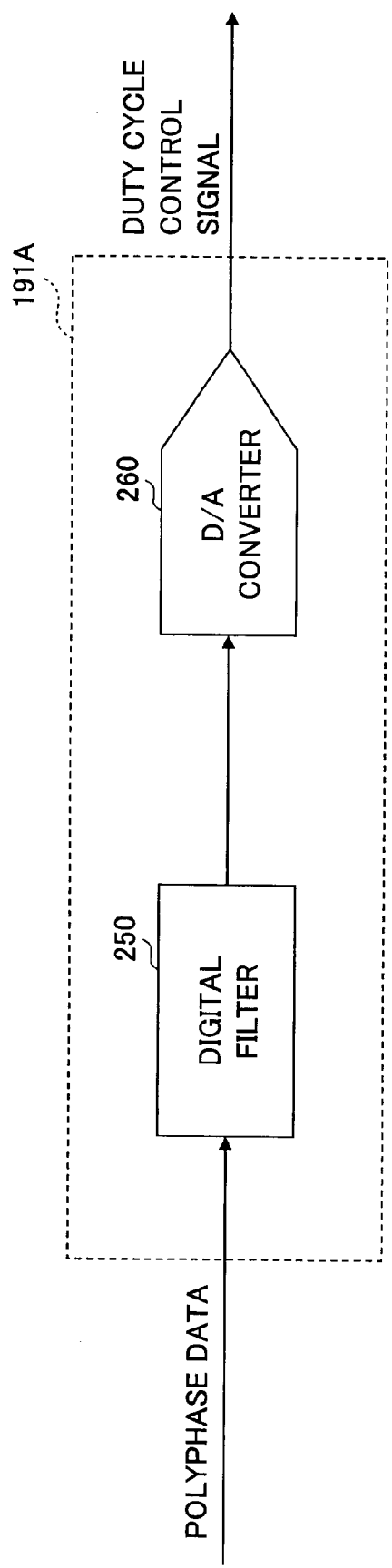
FIG. 21 is a diagram showing an example of other circuit configuration realizing an average value detection unit 191.

Further, the average value detection unit 191 of the present embodiment may be realized by using a configuration other than the above-mentioned circuit configuration. FIG. 21 is a diagram showing an example of other circuit configuration realizing an average value detection unit 191 of the present embodiment.

An average value detection unit 191A shown in FIG. 21 includes a digital filter 250 and a D/A converter 260. The average value detection unit 191A adds the polyphase data and detects the average value as performed by the adding circuit 230 and the low-pass filter 240 shown in FIG. 20.

The digital filter 250 performs processing for detecting the average value of the polyphase data of digital values. The process result is converted to analog values by the D/A converter 260 and the analog-converted values are output to the control unit 23. The control unit 23 outputs the duty cycle control signal to the binarization unit 21 based on a result of comparison of the average value with the reference value. In this case, the digital filter 250 may be realized by using an FIR (Finite Impulse Response) filter, an IIR (Infinite Impulse Response) filter, and the like.

In accordance with such a configuration, the digital circuit is used so as to detect the average value, so that it is possible to provide a data processing apparatus capable of preventing an increase of a circuit size and reducing power consumption.

[Embodiment 8]

In the following, embodiment 8 of the present invention is described with reference to the drawings. FIG. 22 is a diagram showing an example of a functional block diagram of a data processing apparatus 200G according to embodiment 8. The data processing apparatus 200G of embodiment 8 is different from embodiment 7 in that the control unit 23 of the data processing apparatus 200F shown in FIG. 19 described in embodiment 7 is replaced by a digital comparison circuit 270. Thus, elements or portions in FIG. 22 having the same functions or configurations as in embodiment 7 are provided with the same reference numerals used for describing embodiment 7 and description of those elements or portions is omitted.

The data processing apparatus 200G of embodiment 8 includes the average value detection unit 191A described in embodiment 7. When the average value of the polyphase data of digital values is detected through the processing of the digital filter 250, the average value is supplied to the digital comparison circuit 270.

In the digital comparison circuit 270, a reference value is set in advance. The digital comparison circuit 270 performs processing for digitally comparing the reference value with the average value. Then, the comparison processing result is output as a digital value. This comparison result is supplied to the D/A converter 260 where the duty cycle control signal is converted to an analog value, and then the duty cycle control signal is supplied to the binarization unit 21.

In accordance with such a configuration, the average value of the polyphase data is detected, the duty cycle is calculated from the average value, and the duty cycle control upon binarization of the input data is performed based on the result of the calculated duty cycle. Thus, it is possible to capture the binarized input data in a more accurate manner. Moreover, the polyphase data is captured from the binary output in synchronization with the polyphase clocks and the polyphase data is restored, so that it is possible to restore the input data in a more accurate manner.

Further, the circuit used for controlling the duty cycle of the input data is digitized, so that it is possible to provide a data processing apparatus capable of preventing an increase of a circuit size and reducing power consumption.

It is possible to apply the present invention to a data processing apparatus binarizing input data based on a threshold voltage.

The present invention is not limited to the specifically disclosed embodiment, and variations and modifications may be made without departing from the scope of the present invention.

The present application is based on Japanese priority application No. 2006-171607 filed Jun. 21, 2006, the entire contents of which are hereby incorporated herein by reference.

What is claimed is:

1. A data processing apparatus comprising:
    a binarization unit binarizing input data based on a threshold voltage and configured to output only a binary output from a single connection point between a drain of a PMOS transistor and a drain of a NMOS transistor;
    a capture unit capturing data from the binary output binarized by the binarization unit;
    a duty cycle detection unit detecting a duty cycle of the binary output; and
    a control unit, implemented via a processor, controlling a level of the input data based on the duty cycle detected by the duty cycle detection unit and configured to output only a single control signal directly into a gate of another PMOS transistor of the binarization unit, wherein a drain current value of the another PMOS transistor is varied in accordance with a change of the single control signal,
    wherein the duty cycle detection unit is configured to detect the duty cycle of the binary output from an average value of the binary output and pulse values when the binary output is at a high (H) level and at a low (L) level.

2. The data processing apparatus according to claim 1, wherein the capture unit includes:
    a clock generation unit generating a clock for determining a time when data is captured from the binary output binarized by the binarization unit; and
    a data capture unit capturing data from the binary output in synchronization with the clock generated by the clock generation unit.

3. The data processing apparatus according to claim 2, wherein the clock generation unit generates a synchronous clock synchronized with the binary output binarized by the binarization unit.

4. The data processing apparatus according to claim 1, wherein the capture unit includes:
    a polyphase clock generation unit generating a polyphase clock for determining a time when data is captured from the binary output binarized by the binarization unit;
    a polyphase data capture unit capturing polyphase data from the binary output in synchronization with the polyphase clock generated by the polyphase clock generation unit; and
    a data recovery unit restoring the data captured from the binary output using the polyphase clock generated by the polyphase clock generation unit and the polyphase data captured by the polyphase data capture unit.

5. The data processing apparatus according to claim 1, wherein the control unit controls the level of the input data such that the duty cycle is 50%.

6. The data processing apparatus according to claim 1, wherein
    the binarization unit includes:
    a differential amplifier circuit receiving the input data;
    a variable current source connected to an output of the differential amplifier circuit; and
    an amplitude-limiting unit limiting amplitude of a voltage at a connection point between the output of the differential amplifier circuit and the variable current source.

7. The data processing apparatus according to claim 1, wherein the duty cycle detection unit includes a low-pass filter.

8. A data processing apparatus comprising:
    a binarization unit binarizing input data based on a threshold voltage and configured to output only a binary output from a single connection point between a drain of a PMOS transistor and a drain of a NMOS transistor;
    a capture unit capturing data from the binary output binarized by the binarization unit;
    a simulated pulse generation unit generating simulated pulses of the binary output to be captured in the capture unit;
    a duty cycle detection unit detecting a duty cycle of the simulated pulses generated by the simulated pulse generation unit; and
    a control unit, implemented via a processor, controlling a level of the input data based on the duty cycle detected by the duty cycle detection unit and configured to output only a single control signal directly into a gate of another PMOS transistor of the binarization unit, wherein a drain current value of the another PMOS transistor is varied in accordance with a change of the single control signal,
    wherein the duty cycle detection unit is configured to detect the duty cycle of the simulated pulses of the binary output from an average value of the simulated pulses and pulse values when the simulated pulses are at a high (H) level and at a low (L) level.

9. The data processing apparatus according to claim 8, wherein
    the capture unit includes:
    a clock generation unit generating a clock for determining a time when data is captured from the binary output binarized by the binarization unit; and
    a data capture unit capturing data from the binary output in synchronization with the clock generated by the clock generation unit.

10. The data processing apparatus according to claim 9, wherein the clock generation unit generates a synchronous clock synchronized with the binary output binarized by the binarization unit.

11. A data processing apparatus comprising:

a binarization unit binarizing input data based on a threshold voltage and configured to output only a binary output from a single connection point between a drain of a PMOS transistor and a drain of a NMOS transistor;

a capture unit capturing data from the binary output binarized by the binarization unit;

an average value detection unit detecting an average value of the binary output; and a control unit, implemented via a processor, controlling a level of the input data based on the average value detected by the average value detection unit and configured to output only a single control signal directly into a gate of another PMOS transistor of the binarization unit, wherein a drain current value of the another PMOS transistor is varied in accordance with a change of the single control signal, wherein a duty cycle of the binary output is detected from the average value of the binary output and pulse values when the binary output is at a high (H) level and at a low (L) level.

12. The data processing apparatus according to claim 11, wherein the capture unit includes:

a polyphase clock generation unit generating a polyphase clock for determining a time when data is captured from the binary output binarized by the binarization unit; and a polyphase data capture unit capturing polyphase data from the binary output in synchronization with the polyphase clock generated by the polyphase clock generation unit, and the average value detection unit detects an average value of the polyphase data captured by the polyphase data capture unit.

13. The data processing apparatus according to claim 11, including:

a D/A conversion unit receiving an output signal of the control unit, wherein the average value detection unit and the control unit are configured using a digital circuit, and the level of the input data is controlled based on an analog value signal converted by the D/A conversion unit.

14. The data processing apparatus according to claim 12, including:

a D/A conversion unit receiving an output signal of the control unit, wherein the average value detection unit and the control unit are configured using a digital circuit, and the level of the input data is controlled based on an analog value signal converted by the D/A conversion unit.

* * * * *